(12) United States Patent  
Lu

(10) Patent No.: US 11,973,120 B2  
(45) Date of Patent: Apr. 30, 2024

(54) MINIATURIZED TRANSISTOR STRUCTURE WITH CONTROLLED DIMENSIONS OF SOURCE/DRAIN AND CONTACT-OPENING AND RELATED MANUFACTURE METHOD

(71) Applicant: Etron Technology, Inc., Hsinchu (TW)

(72) Inventor: Chao-Chun Lu, Taipei (TW)

(73) Assignees: Etron Technology, Inc., Hsinchu (TW); Invention And Collaboration Laboratory Pte. Ltd., Singapore (SG)

(*) Notice: Subject to any disclaimer, the term of this patent is extended or adjusted under 35 U.S.C. 154(b) by 31 days.

(21) Appl. No.: 17/151,635

(22) Filed: Jan. 18, 2021

(65) Prior Publication Data

US 2021/0408245 A1  Dec. 30, 2021

Related U.S. Application Data

(60) Provisional application No. 63/043,135, filed on Jun. 24, 2020.

(51) Int. Cl.
| | |
|---|---|
| *H01L 21/786* | (2006.01) |
| *H01L 21/762* | (2006.01) |
| *H01L 29/06* | (2006.01) |
| *H01L 29/40* | (2006.01) |
| *H01L 29/417* | (2006.01) |
| *H01L 29/66* | (2006.01) |
| *H01L 29/78* | (2006.01) |

(52) U.S. Cl.
CPC .. *H01L 29/41725* (2013.01); *H01L 21/76224* (2013.01); *H01L 29/0653* (2013.01); *H01L 29/401* (2013.01); *H01L 29/66492* (2013.01); *H01L 29/66545* (2013.01); *H01L 29/7833* (2013.01)

(58) Field of Classification Search
None
See application file for complete search history.

(56) References Cited

U.S. PATENT DOCUMENTS

| 6,187,619 B1 * | 2/2001 | Wu .................... H01L 27/0266 |
| | | 257/E21.624 |
| 6,261,924 B1 | 7/2001 | Mandelman |
| 2001/0050395 A1 * | 12/2001 | Esaki ................ H01L 29/41775 |
| | | 257/E21.628 |
| 2007/0228457 A1 | 10/2007 | Mori |

(Continued)

FOREIGN PATENT DOCUMENTS

| EP | 1 296 366 A2 | 3/2003 |
| EP | 1 296 366 A3 | 12/2004 |

(Continued)

*Primary Examiner* — Joseph C. Nicely  
*Assistant Examiner* — Lamont B Koo  
(74) *Attorney, Agent, or Firm* — Winston Hsu

(57) ABSTRACT

A transistor structure includes a semiconductor substrate, a gate structure, a channel region, a first conductive region, and a first isolation region. The semiconductor substrate has a semiconductor surface. The gate structure has a length. The first conductive region is electrically coupled to the channel region. The first isolation region is next to the first conductive region. A length of the first conductive region between the gate structure and the first isolation is controlled by a single photolithography process which is originally configured to define the length of the gate structure.

13 Claims, 24 Drawing Sheets

(56) References Cited

U.S. PATENT DOCUMENTS

| | | |
|---|---|---|
| 2009/0302392 A1 | 12/2009 | Slesazeck |
| 2011/0159654 A1 | 6/2011 | Kronholz |
| 2014/0077300 A1* | 3/2014 | Noel .................. H01L 27/1108 |
| | | 257/351 |
| 2015/0108651 A1 | 4/2015 | Chen |
| 2016/0181399 A1 | 6/2016 | Jun |
| 2016/0268392 A1 | 9/2016 | Zhu |
| 2017/0162574 A1 | 6/2017 | Kim |
| 2018/0061824 A1 | 3/2018 | Li |
| 2018/0277542 A1* | 9/2018 | Liaw .................... H01L 29/785 |
| 2018/0350809 A1 | 12/2018 | Cheng |
| 2018/0366329 A1 | 12/2018 | Kim |
| 2019/0123162 A1 | 4/2019 | Xie |
| 2019/0172752 A1* | 6/2019 | Hsu .................. H01L 21/31144 |
| 2019/0304976 A1 | 10/2019 | Zhu |
| 2019/0371724 A1 | 12/2019 | Jun |
| 2019/0371933 A1 | 12/2019 | Chen |
| 2020/0126857 A1 | 4/2020 | Tsai |
| 2020/0126983 A1 | 4/2020 | Cheng |
| 2020/0266271 A1 | 8/2020 | Lin |
| 2020/0312980 A1 | 10/2020 | Frougier |
| 2021/0036121 A1* | 2/2021 | Lim .................. H01L 29/78696 |
| 2022/0301939 A1 | 9/2022 | Kim |
| 2022/0336268 A1 | 10/2022 | Wang |

FOREIGN PATENT DOCUMENTS

| | | |
|---|---|---|
| JP | 4-171943 A | 6/1992 |
| JP | 9-55479 A | 2/1997 |
| JP | 2000-294776 A | 10/2000 |
| JP | 2001-102443 A | 4/2001 |
| JP | 2003-297951 A | 10/2003 |
| JP | 2009-4800 A | 1/2009 |
| JP | 2021-132096 A | 9/2021 |
| KR | 10-2002-0079792 A | 10/2002 |
| KR | 10-2016-0074122 A | 6/2016 |
| KR | 10-2016-0133706 A | 11/2016 |
| KR | 10-2017-0121667 A | 11/2017 |
| KR | 10-2018-0060952 A | 6/2018 |
| KR | 10-2018-0137861 A | 12/2018 |
| KR | 10-2019-0064376 A | 6/2019 |
| KR | 10-2019-0138012 A | 12/2019 |
| KR | 10-2020-0045943 A | 5/2020 |
| TW | 202117877 A | 5/2021 |

* cited by examiner

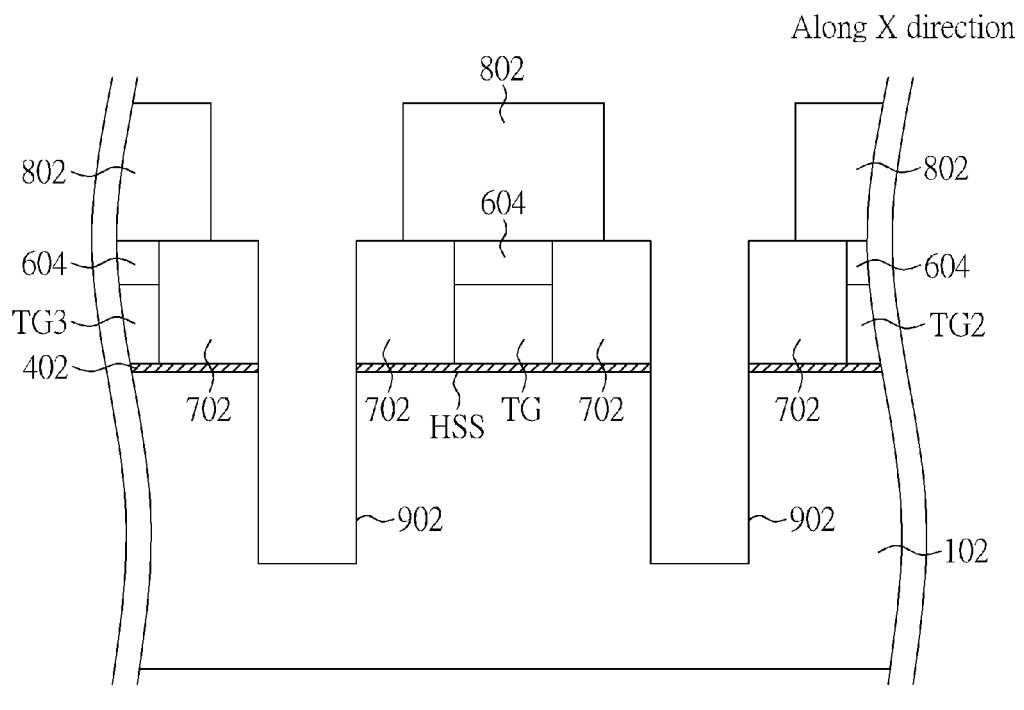
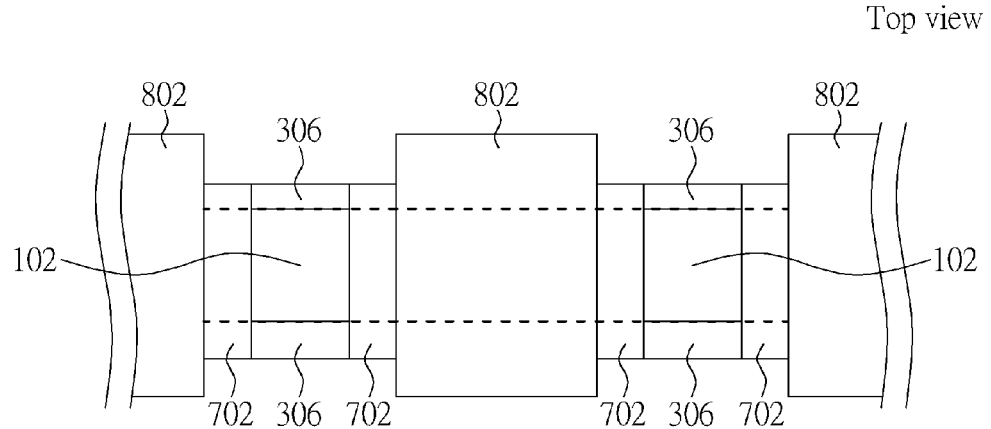
FIG. 9

Along X direction
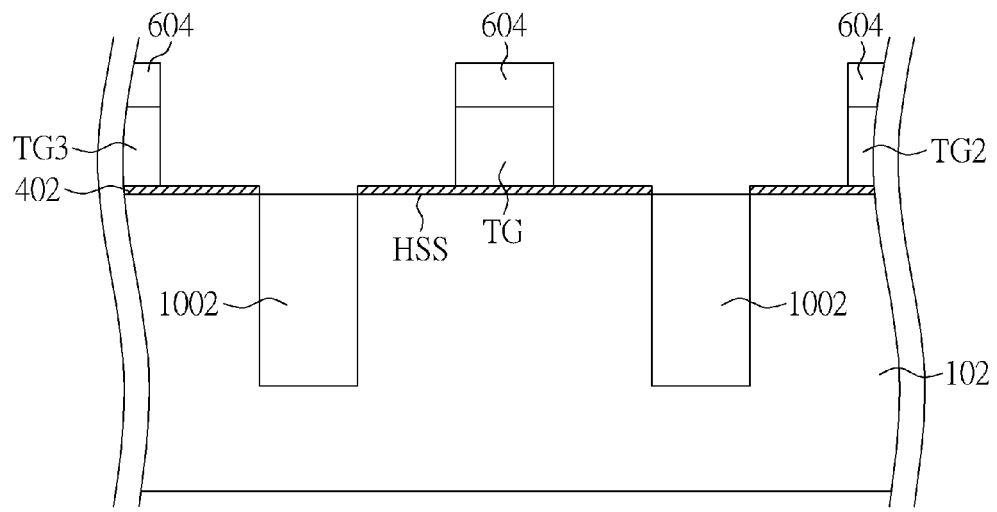
(a)
Top view
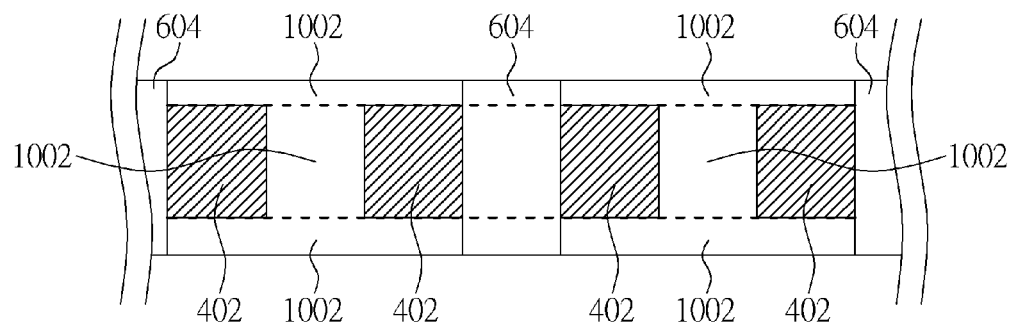
(b)
FIG. 10

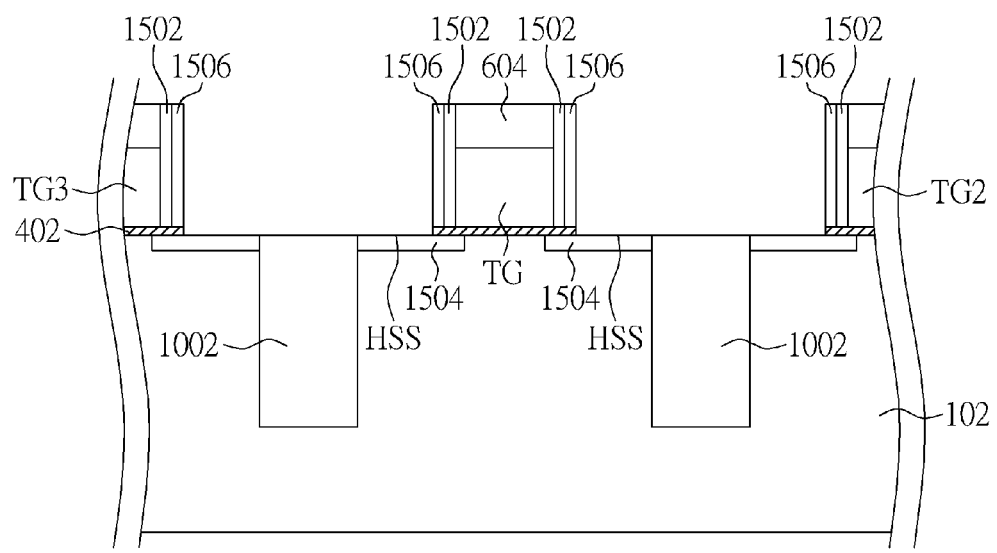
(a)
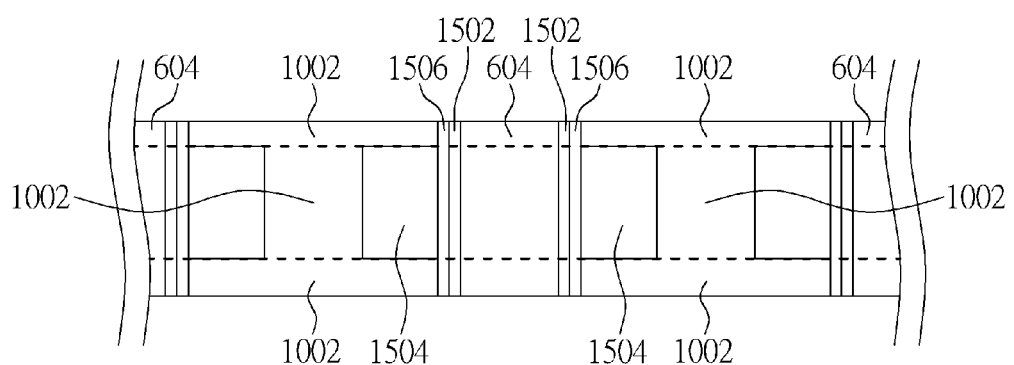
(b)
FIG. 15

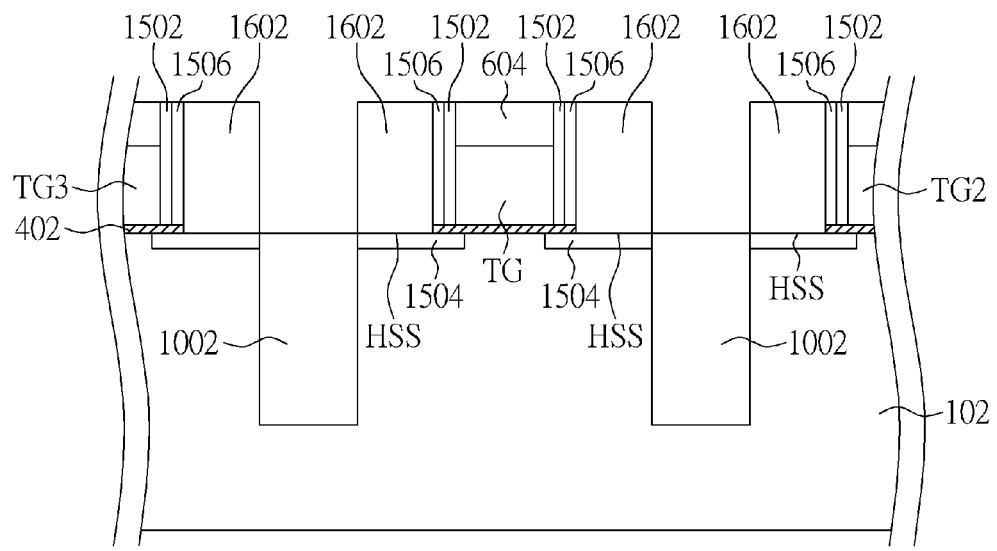
(a)
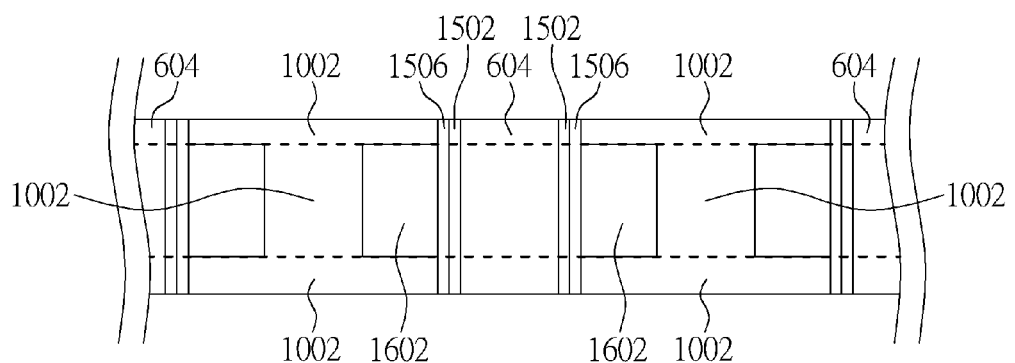
(b)
FIG. 16

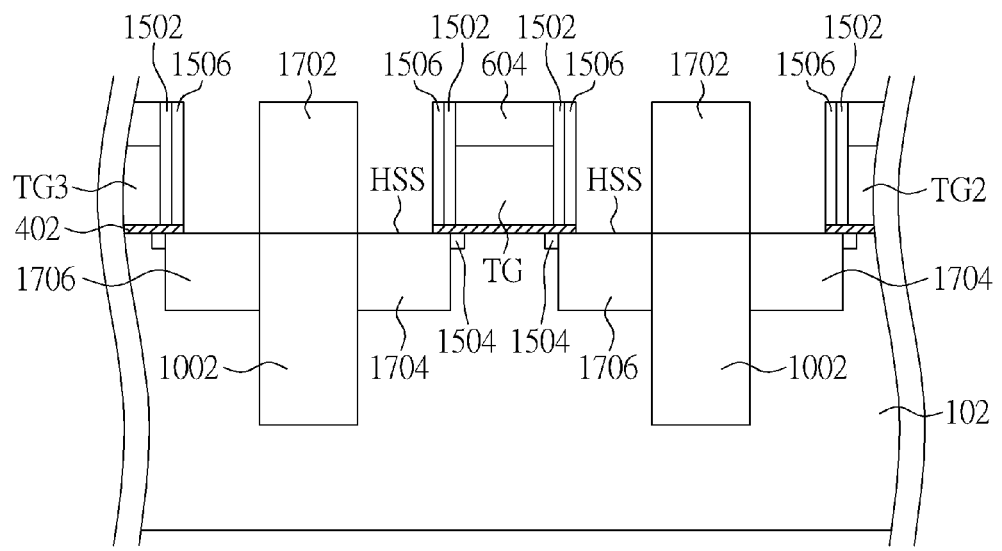
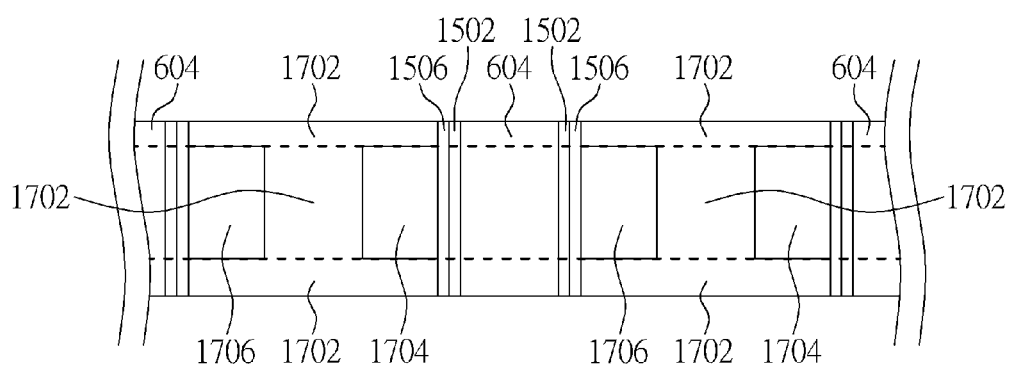
FIG. 17

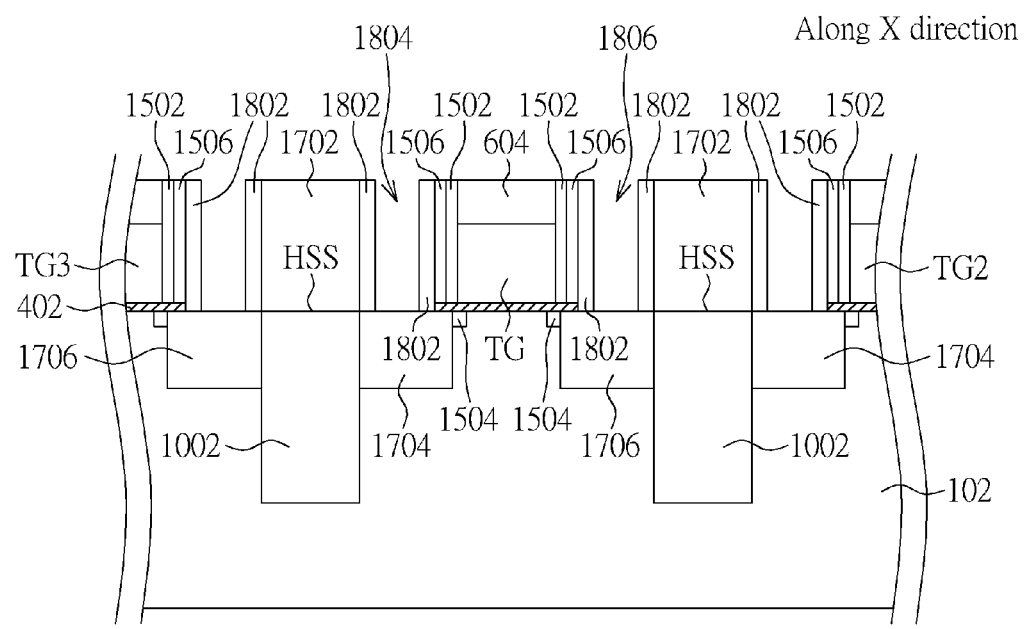
(a)
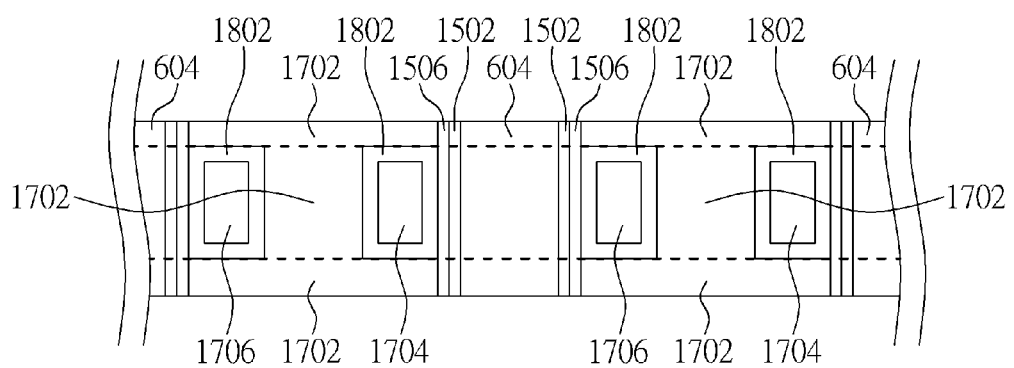
(b)
FIG. 18

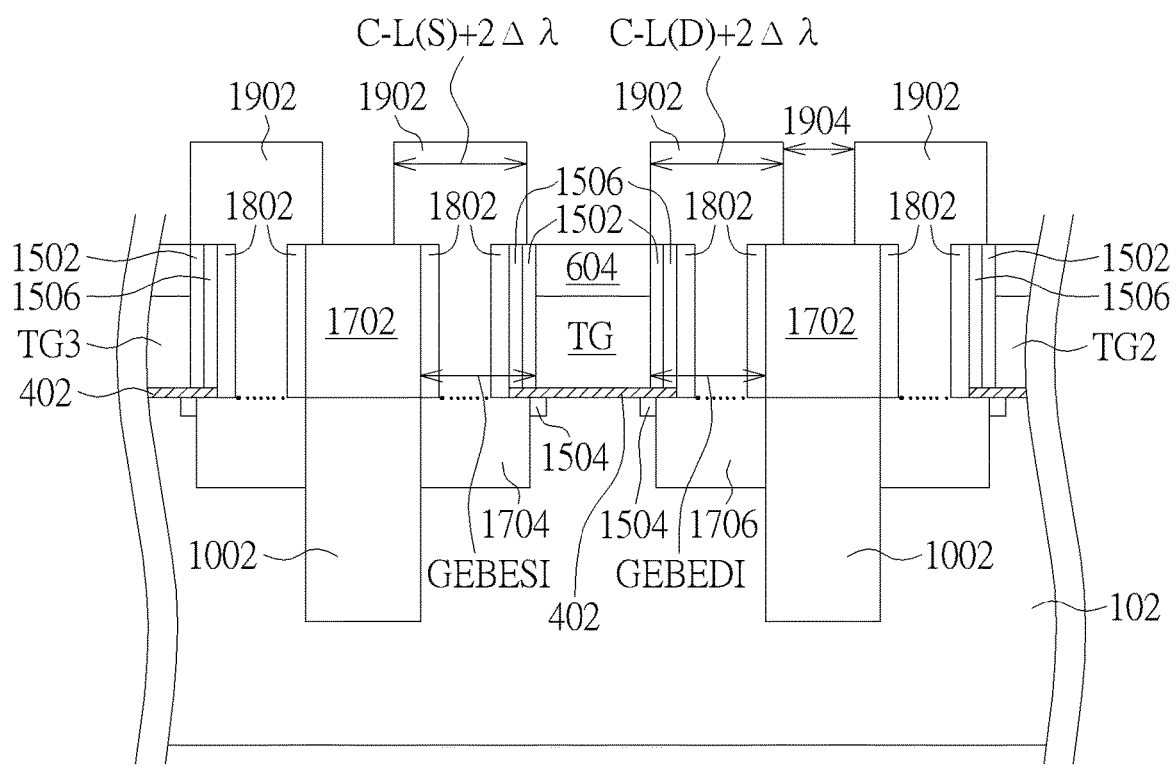
FIG. 19  Along X direction
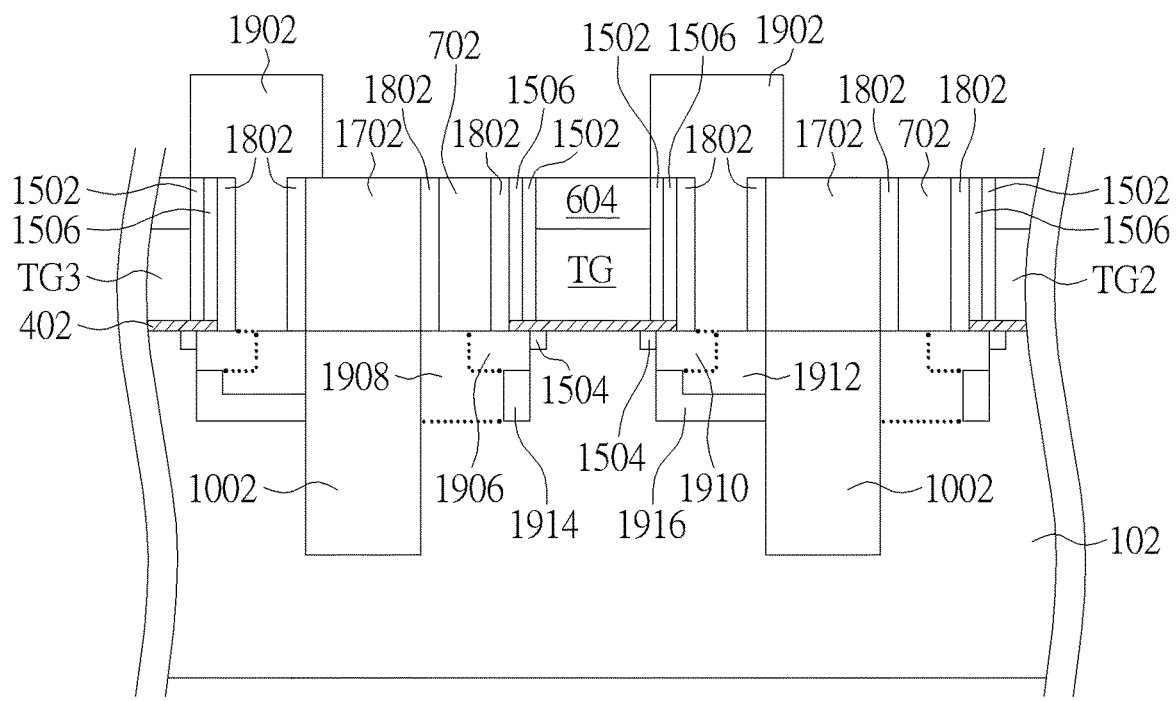
FIG. 20  Along X direction

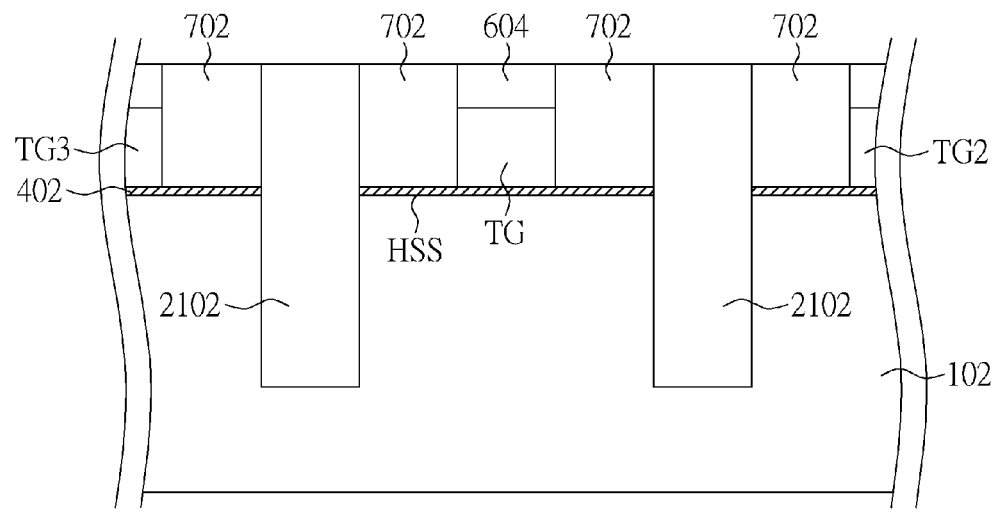
(a)
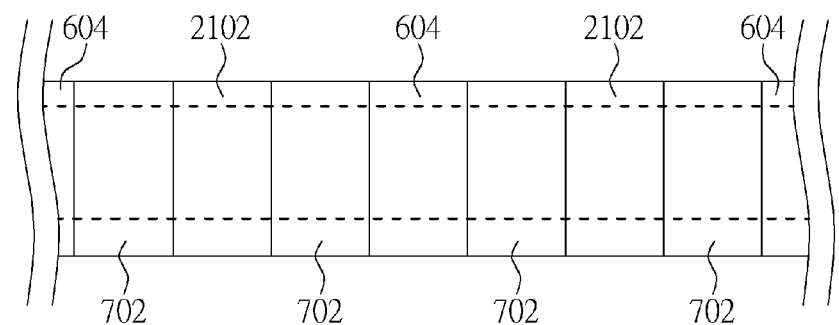
(b)
FIG. 21

Along X direction
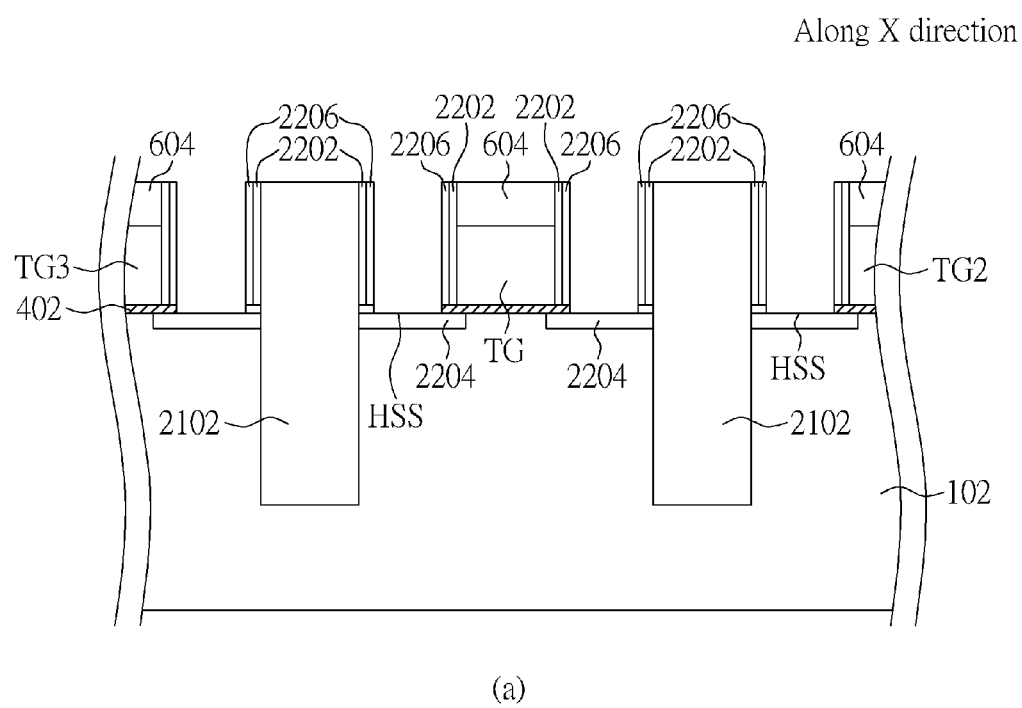
(a)
Top view
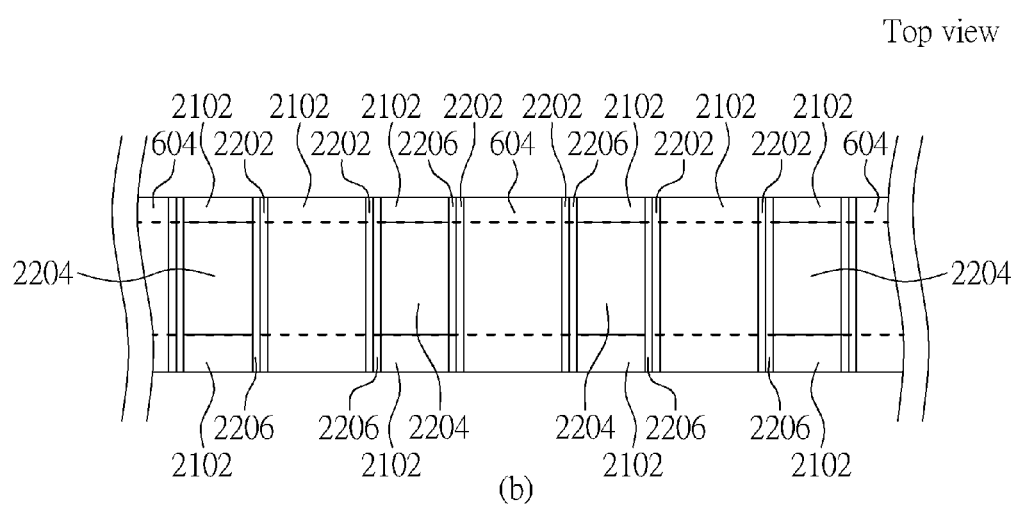
(b)
FIG. 22

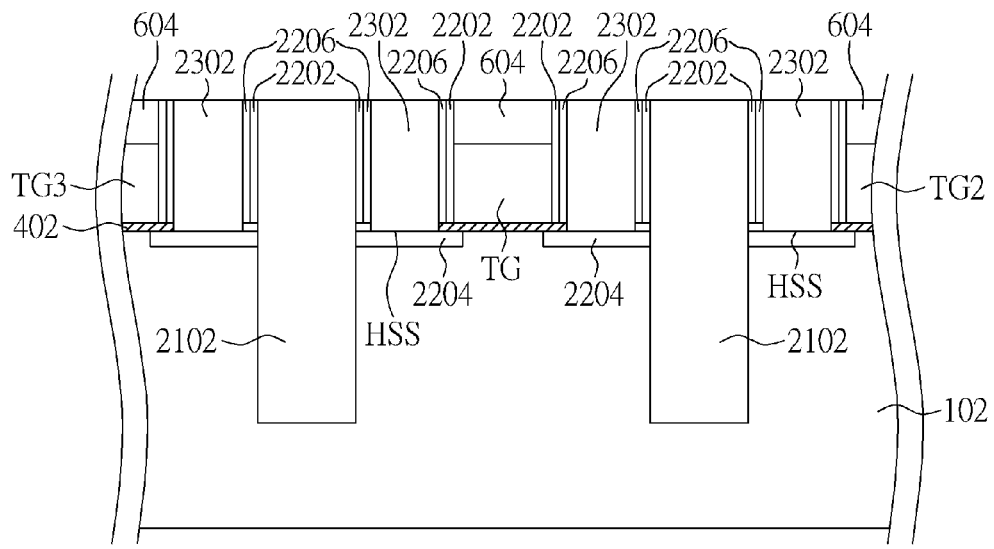
(a)
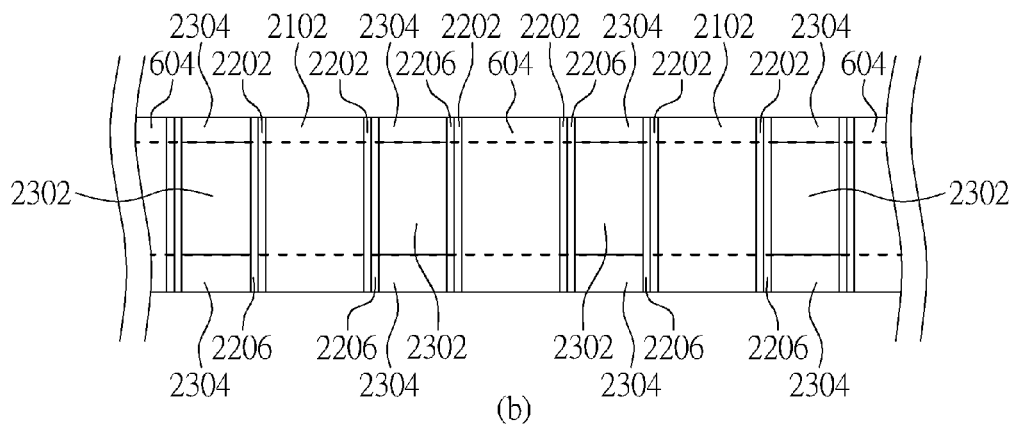
(b)
FIG. 23

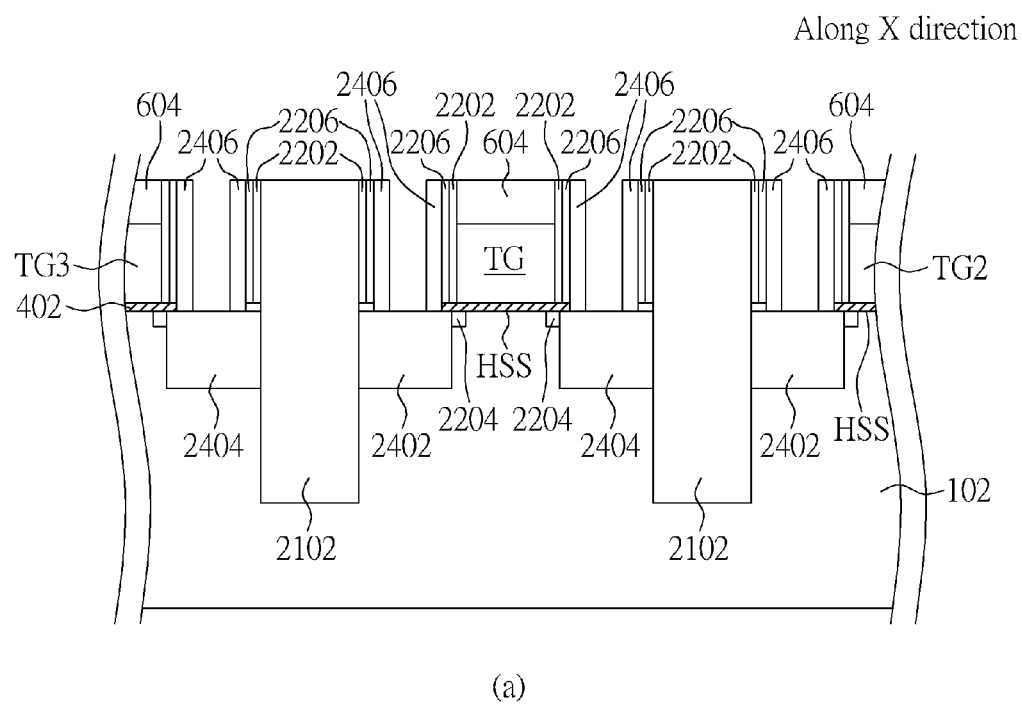
(a)
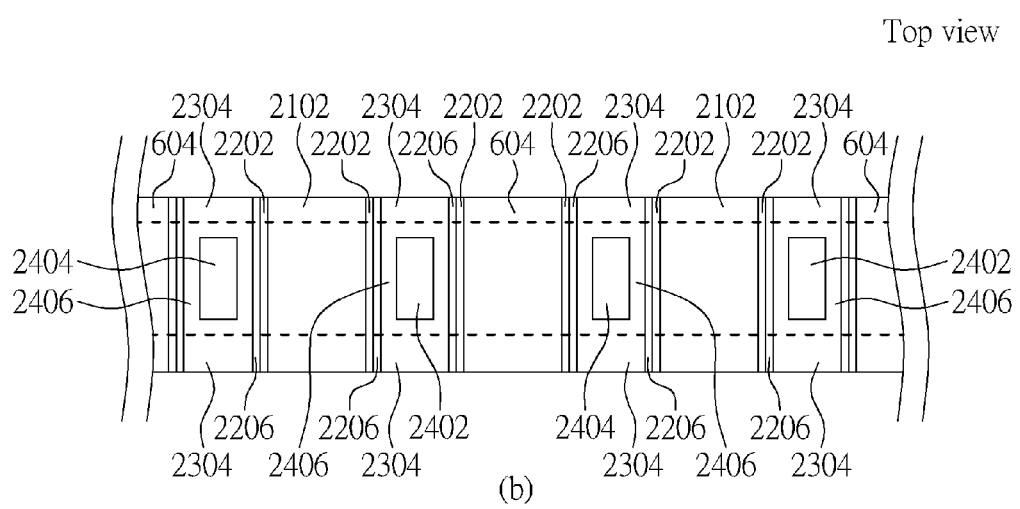
(b)
FIG. 24

MINIATURIZED TRANSISTOR STRUCTURE WITH CONTROLLED DIMENSIONS OF SOURCE/DRAIN AND CONTACT-OPENING AND RELATED MANUFACTURE METHOD

CROSS REFERENCE TO RELATED APPLICATIONS

This application claims the benefit of U.S. Provisional Application No. 63/043,135, filed on Jun. 24, 2020 and entitled "Miniaturized MOSFET with Precisely Controlled Lengths of Source/Drain and Contact-Opening by Avoiding Photolithographic Misalignment Tolerances", the contents of which are incorporated herein by reference.

BACKGROUND OF THE INVENTION

1. Field of the Invention

The present invention relates to a transistor structure and a related manufacture method, and particularly to a transistor structure which can have precisely controlled lengths of source/drain and contact-opening to effectively shrink a size of the transistor structure.

2. Description of the Prior Art

Since design guidelines of scaling down all dimensions of a metal-oxide-semiconductor field-effect transistor (MOSFET) have been disclosed in the paper published by R. Dennard, et al. in 1974, how to shrink a size of a transistor is a major technology demand which has changed the minimum physical feature size on a linear dimension of a silicon wafer from several micrometers down to several nanometers. The minimum feature size or length, usually called as Lamda ($\lambda$), is determined by the microminiaturization capability of using a photolithographic masking technology with device scaling technology (measured by minimized printed line-width resolution also called as $\lambda$ for simplicity of illustration and comparison purpose). But, another hard-to-control factor which limits the device shrinking is so-called misalignment tolerance due to both inadequacy and inaccuracy of the photolithographic equipment, that is, a Delta-Lamda ($\Delta\lambda$). Furthermore, due to the misalignment tolerance, a distance between a gate edge of the transistor to a source (or a drain) edge of the transistor is hard to be made smaller than a sum of $\lambda$ and $\Delta\lambda$. Afterwards if it is needed to make a square-shaped contact hole on the drain (or the source) for connection between future metal interconnection to the drain (or the source) by using again the photolithographic masking technology, the minimum size of the square-shaped contact hole is hard to be made smaller than $\lambda$ on each side of the square-shaped contact hole. Furthermore by including the misalignment tolerance of ensuring the square-shaped contact hole within the drain, a length of each edge of the drain (with rectangular shape) is hard to be made less than the sum of $\lambda$ and $\Delta\lambda$. However, shrinking the size of the transistor is essential to integrate more transistors within a planar area of a silicon wafer, and a necessary and effective way of achieving the above-mentioned goal is to shrink areas occupied by sources and drains of the transistors, respectively, which can also help reduction of leakage currents and power consumption. Therefore, how to effectively shrink the size of the transistor to integrate more transistors within the planar area of the silicon wafer has become an important issue for a designer of the transistor.

SUMMARY OF THE INVENTION

An embodiment of the present invention provides a transistor structure. The transistor structure includes a semiconductor substrate, a gate structure, a channel region, a first conductive region, and a first isolation region. The semiconductor substrate has a semiconductor surface. The gate structure has a length. The first conductive region is electrically coupled to the channel region. The first isolation region is next to the first conductive region. A length of the first conductive region between the gate structure and the first isolation is controlled by a single photolithography process which is originally configured to define the length of the gate structure.

According to another aspect of the invention, the length of the first conductive region is substantially equal to the length of the gate structure.

Another embodiment of the present invention provides a transistor structure. The transistor structure includes a semiconductor substrate, a gate structure, a channel region, a first conductive region, and a first contact hole. The semiconductor substrate has a semiconductor surface. The gate structure has a length. The first conductive region is electrically coupled to the channel region. The first contact hole is positioned above the first conductive region. A periphery of the first contact hole is independent from a photolithography process, and the periphery of the first contact hole is within a circumference of the first conductive region.

According to another aspect of the invention, the periphery of the first contact hole is surrounded by the circumference of the first conductive region.

Another embodiment of the present invention provides a manufacture method for a transistor, wherein the transistor includes a gate structure, a channel region, and a first conductive region electrically coupled to the channel region. The manufacture method includes implementing a first photolithography process which is configured to define a width of the gate structure and a pseudo length of an active region; and implementing a second photolithography process which is configured to define a length of the gate structure in the active region; wherein the second photolithography process is further configured to control a length of the first conductive region between the gate structure and an isolation region.

According to another aspect of the invention, the pseudo length of the active region defined by the first photolithography process is approximately 4 times the length of the gate structure.

Another embodiment of the present invention provides a transistor structure. The transistor structure includes a semiconductor substrate, a gate structure, a channel region, a first conductive region, and a first contact hole. The semiconductor substrate has a semiconductor surface. The gate structure has a length. The first conductive region is electrically coupled to the channel region. The first contact hole is positioned above the first conductive region. The first contact hole includes a periphery surrounded by a circumference of the first conductive region, and a shape of the periphery of the first contact hole is similar to a shape of the circumference of the first conductive region.

According to another aspect of the invention, the circumference of the first conductive region is a rectangular-like shape.

Another embodiment of the present invention provides a transistor structure. The transistor structure includes a semiconductor substrate, a gate structure, a channel region, a first conductive region, and a first contact hole. The semiconductor substrate has a semiconductor surface. The gate structure has a length. The first conductive region is electrically coupled to the channel region. The first contact hole is positioned above the first conductive region. A length of the first contact hole is less than the length of the gate structure, and a horizontal distance between a sidewall of the gate structure and a sidewall of the first contact hole which is remote from the gate structure is less than the length of the gate structure.

According to another aspect of the invention, a horizontal distance between the sidewall of the gate structure and a sidewall of the first conductive region which is remote from the gate structure is not greater than the length of the gate structure.

According to another aspect of the invention, a horizontal distance between the sidewall of the gate structure and a sidewall of the first conductive region which is remote from the gate structure is approximately equal to the length of the gate structure.

Another embodiment of the present invention provides a transistor structure. The transistor structure includes a semiconductor substrate, a gate structure, a channel region, a first isolation region, a first spacer, a second spacer, a first conductive region, and a first contact hole. The semiconductor substrate has a semiconductor surface. The gate structure has a length. The channel region is under the semiconductor surface. The first isolation region extends upward and downward from the semiconductor surface. The first spacer covers a first sidewall of the gate structure and a second spacer covers a sidewall of the first isolation region. The first conductive region is electrically coupled to the channel region and positioned between the gate structure and the first isolation region. The first contact hole is above the first conductive region, wherein the first contact hole is formed between the first spacer and the second spacer.

According to another aspect of the invention, the transistor structure further includes a cap layer and a first metal region. The cap layer covers the gate structure. The first metal region fills in the first contact hole and contacts the first conductive region, the first metal region extends upward from the first conductive region to a predetermined position which is higher than a top of the cap layer.

According to another aspect of the invention, a width of the first metal region is substantially equal to a length of the first contact hole plus the length of the gate structure.

According to another aspect of the invention, the transistor structure further includes a second isolation region and a second conductive region. The second isolation region extends upward and downward from the semiconductor surface. The second conductive region is electrically coupled to the channel region and positioned between the gate structure and the second isolation region.

According to another aspect of the invention, a horizontal distance between a second sidewall of the gate structure and a sidewall of the second isolation region remote from the gate structure is substantially equal to the length of the gate structure.

According to another aspect of the invention, the transistor structure further includes a second contact hole. The second contact hole is positioned above the second conductive region, wherein a length of the second contact hole is less than the length of the gate structure.

According to another aspect of the invention, the transistor structure further includes a third spacer and a fourth spacer. The third spacer covers a second sidewall of the gate structure. The fourth spacer covers a sidewall of the second isolation region, wherein the second contact hole is formed between the third spacer and the fourth spacer.

According to another aspect of the invention, the second conductive region includes a second metal containing region in a concave which is under the silicon surface and a second heavily doped semiconductor region in the concave.

According to another aspect of the invention, the transistor structure further includes a second guard isolation layer. The second guard isolation layer is within the concave and contacts to a sidewall of the second metal containing region, wherein the second metal containing region is coupled to the semiconductor substrate through a bottom side of the second metal containing region.

Another embodiment of the present invention provides a transistor structure. The transistor structure includes a semiconductor substrate, a gate structure, a channel region, and a first conductive region. The semiconductor substrate has a semiconductor surface. The gate structure has a length. The first conductive region is electrically coupled to the channel region. A length of the first conductive region is controlled by a single photolithography process which is originally configured to define the length of the gate structure.

According to another aspect of the invention, the length of the first conductive region is substantially equal to the length of the gate structure.

Another embodiment of the present invention provides a transistor structure. The transistor structure includes a semiconductor substrate, a gate structure, a channel region, a first conductive region, and a first contact hole. The semiconductor substrate has a semiconductor surface. The gate structure has a length. The first conductive region is electrically coupled to the channel region. The first contact hole is positioned above the first conductive region. A periphery of the first contact hole is independent from a photolithography process.

According to another aspect of the invention, the periphery of the first contact hole is surrounded by a circumference of the first conductive region.

Another embodiment of the present invention provides a transistor structure. The transistor structure comprises a semiconductor substrate with a semiconductor surface, a gate structure, a channel region under the gate structure, a first conductive region electrically coupled to the channel region, and a contact hole positioned above the first conductive region. Wherein a length of the contact hole is less than a minimum feature length.

According to another aspect of the invention, a horizontal distance between a sidewall of the gate structure and a sidewall of the contact hole which is remote from the gate structure is less than the minimum feature length.

According to another aspect of the invention, a horizontal distance between the sidewall of the gate structure and a sidewall of the first conductive region which is remote from the gate structure is approximately equal to the minimum feature length.

Another embodiment of the present invention provides a manufacture method for a transistor, wherein the transistor includes agate structure and a first conductive region. The manufacture method includes forming an active region based on a substrate; forming the gate structure and a dummy shield gate structure above the active region; forming a first isolation region to replace the dummy shield gate structure; forming a self-alignment pillar above the active region; and removing the self-alignment pillar and forming the first conductive region between the gate structure and the first isolation region.

According to another aspect of the invention, before the step of removing the self-alignment pillar, the manufacture method further includes forming a second isolation region above the first isolation region, wherein the self-alignment pillar is between the gate structure and the second isolation region.

According to another aspect of the invention, after removing the self-alignment pillar, the manufacture method further includes forming a spacer between the gate structure and the first isolation region to define a contact hole; wherein the contact hole is above the first conductive region.

According to another aspect of the invention, a length of the contact hole is less than a minimum feature length.

According to another aspect of the invention, the substrate is a silicon substrate, and the self-alignment pillar is an intrinsic silicon pillar formed by selective epitaxy growth.

Another embodiment of the present invention provides a manufacture method for a transistor, wherein the transistor includes agate structure and a first conductive region. The manufacture method includes forming an active region based on a substrate; forming the gate structure based on the active region; and forming a self-alignment pillar configured to allocate a contact hole above the first conductive region.

According to another aspect of the invention, the manufacture method further includes forming an isolation region based on the active region before forming the self-alignment pillar.

According to another aspect of the invention, the manufacture method further includes removing the self-alignment pillar which is formed between the gate structure and the isolation region; and forming a spacer between the gate structure and the isolation region to define a contact hole; wherein the contact hole is above the first conductive region.

According to another aspect of the invention, a length of the contact hole is less than a minimum feature length.

Another embodiment of the present invention provides a manufacture method for a transistor, wherein the transistor includes agate structure and a first conductive region. The manufacture method includes forming an active region based on a substrate; forming the gate structure above the active region; forming the first conductive region next to the gate structure; and defining a contact hole above the first conductive region, wherein defining the contact hole is independent from a photolithography process.

According to another aspect of the invention, the first conductive region is formed between the gate structure and an isolation region which is extended upward above the active region.

According to another aspect of the invention, the contact hole is defined by forming a spacer which covers a sidewall of the gate structure and a sidewall of the isolation region.

According to another aspect of the invention, a length of the contact hole is less than a minimum feature length.

Another embodiment of the present invention provides a manufacture method for a transistor, wherein the transistor includes agate structure and a first conductive region. The manufacture method includes forming an active region based on a substrate; forming the gate structure based on the active region; forming the first conductive region next to the gate structure; and forming a contact hole above the first conductive region without using a photolithography process to define a shape of the contact hole.

According to another aspect of the invention, the first conductive region is formed between the gate structure and an isolation region.

According to another aspect of the invention, the contact hole is defined by forming a spacer which covers a sidewall of the gate structure and a sidewall of the isolation region.

According to another aspect of the invention, a length of the contact hole is less than a minimum feature length.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 9 is a diagram illustrating the dummy shield gate (DSG), the nitride layer, the dielectric insulator, and the p-type substrate corresponding to the DSG being removed by the anisotropic etching technique.

FIG. 10 is a diagram illustrating the gate mask layer being removed, the SOD being etched, and an oxide-2 layer being deposited to form a STI-oxide2.

FIG. 15 is a diagram illustrating the oxide-3 layer being deposited and etched to form the oxide-3 spacer, the lightly Doped drains (LDDs) being formed in the p-type substrate, the nitride layer being deposited and etched back to form the nitride spacer, and the dielectric insulator being removed.

FIG. 16 is a diagram illustrating the intrinsic silicon electrode being grown by the selective epitaxy growth (SEG) technique.

FIG. 17 is a diagram illustrating the CVD-STI-oxide3 layer being deposited and etched back, the intrinsic silicon electrode being removed, and the source (n+ source) and the drain (n+ drain) of the mMOSFET being formed.

FIG. 18 is a diagram illustrating the oxide spacer being deposited and etched to form the contact-hole openings.

FIG. 19 is a diagram illustrating the metal-1 layer being deposited and etched to form the metal-1 interconnections.

FIG. 20 is a diagram illustrating the metal-1 interconnections being formed, and the source and the drain being formed by using the merged semiconductor junction and metal conductor (MSMC) structure according to another embodiment of the present invention.

FIG. 21 is a diagram illustrating the gate mask layer being removed, then the oxide-2 layer being deposited to fill the trenches and other vacancies on the HSS to form the STI-oxide2, and then the STI-oxide2 being planarized by the chemical mechanical polishing (CMP).

FIG. 22 is a diagram illustrating the oxide-3 layer being deposited and etched to form the oxide-3 spacer, the lightly Doped drains (LDDs) being formed in the p-type substrate, the nitride layer being deposited and etched back to form the nitride spacer, and the dielectric insulator being removed.

FIG. 23 is a diagram illustrating the intrinsic silicon electrode being grown by the selective epitaxy growth (SEG) technique.

FIG. 24 is a diagram illustrating the oxide spacer being deposited and etched to form the contact-hole openings.

DETAILED DESCRIPTION

The present invention discloses a new method to precisely control linear dimensions of a source (or a drain) of a transistor, which can be as small as the minimum feature size, Lamda ($\lambda$), that is allowed to be printed or made on a wafer (e.g. a silicon wafer) without adding the misalignment tolerance, Delta-Lamda ($\Delta\lambda$). Moreover, a contact hole with a linear dimension less than $\lambda$ can be achieved within the drain (or the source). Therefore, the present invention results in a new structure of the source and the drain having the minimum feature size from an edge of a gate of the transistor to an edge of the source (or the drain) next to an edge of a transistor isolation, and have a contact hole on the source and the drain with the linear dimension less than $\lambda$. Therefore, the present invention avoids the misalignment tolerance caused by the photolithographic masking technique in forming both the source and the drain, respectively.

Figure 1:
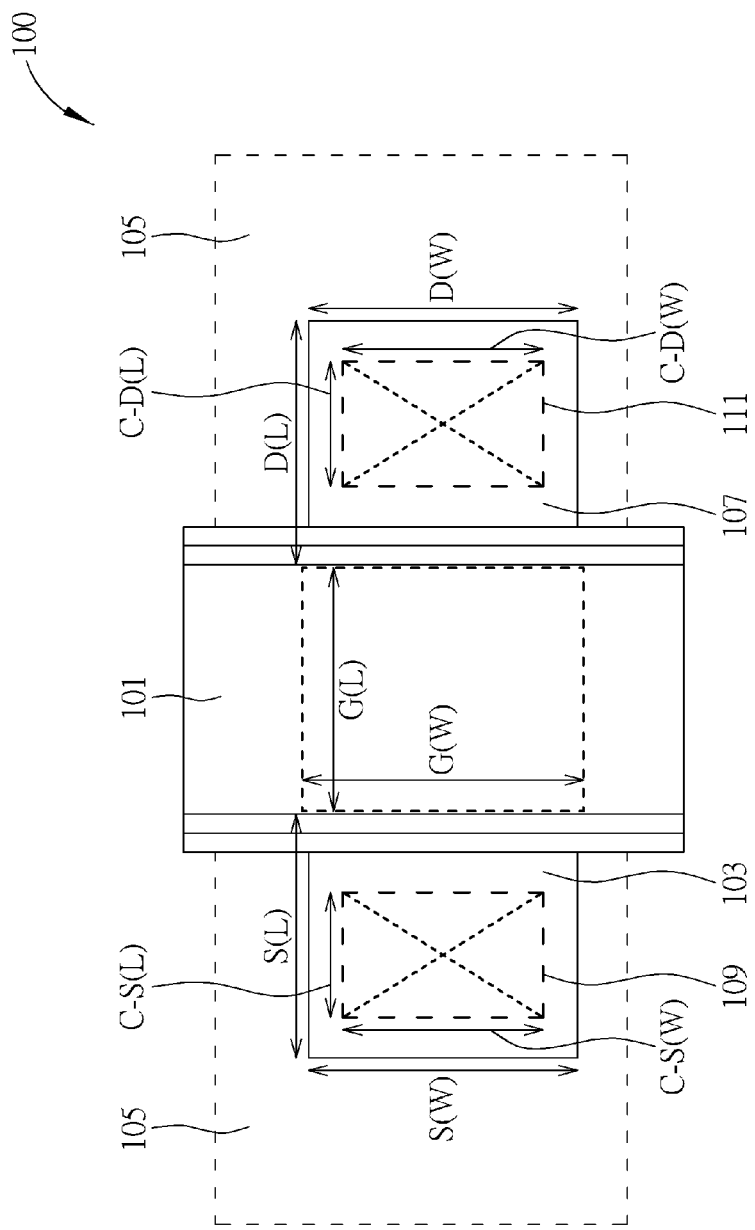
FIG. 1 is a diagram illustrating a top view of a miniaturized metal-oxide-semiconductor field-effect transistor (mMOSFET) according to an embodiment of the present invention.

Please refer to FIG. 1. FIG. 1 is a diagram illustrating a top view of a miniaturized metal-oxide-semiconductor field-effect transistor (mMOSFET) 100 according to an embodiment of the present invention. As shown in FIG. 1, the mMOSFET 100 includes: (1) a gate structure 101 has a length G(L) and a width G(W), (2) on a left-hand side of the gate structure 101, a source 103 has a length S(L) which is a linear dimension from an edge of the gate structure 101 to an edge of an isolation region 105 and a width S(W), (3) on a right-hand side of the gate structure 101, a drain 107 has a length D(L) which is a linear dimension from the edge of the gate structure 101 to the edge of the isolation region 105 and a width D(W), (4) at a center of the source 103, a contact-hole 109 formed by a self-alignment technology has length and width of an opening labeled as C-S(L) and C-S(W), respectively, and (5) similarly at a center of the drain 107, a contact hole 111 formed by the self-alignment technology has length and width of an opening labeled as C-D(L) and C-D(W), respectively.

To form the mMOSFET 100, a first photolithography process can be utilized to define the width G(W) and a pseudo length of an active region, and a second photolithography process can be utilized to define the length G(L) in the active region, wherein the second photolithography process is further utilized to control the length S(L) between the gate structure 101 and the isolation region 105, and in one example the pseudo length of the active region defined by the first photolithography process is approximately 4 times the minimum feature length $\lambda$. In one embodiment, the length G(L) could be equal to or substantially equal to the minimum feature length $\lambda$. Of course, in another example, the length G(L) could be greater than the minimum feature length $\lambda$.

The first feature of the present invention is that both the length S(L) and the length D(L) could be precisely designed and defined according to targeted dimensions which could be produced on a surface of the wafer without being affected by the unavoidable photolithographic misalignment tolerances (PMT).

The second feature of the present invention is that both the length S(L) and the length D(L) can be made as small as the minimum feature length $\lambda$, which is a specified processing limit as defined in a processing node (e.g. the minimal length S(L) or the minimal length D(L) is 7 nm in a specified 7 nm-node, or 28 nm in a specified 28 nm-node, or 180 nm in a specified 180 nm-node, respectively).

The third feature of the present invention is that a minimal dimension (i.e. a distance from a left-hand edge of the source 103 to a right-hand edge of the drain 107) along a length direction of the mMOSFET 100 could be made as small as $3\lambda$ (i.e. one $\lambda$ for the length S(L), one $\lambda$ for the length D(L), and one $\lambda$ for the length G(L)) if the length G(L) is designed to be $\lambda$. Then the mMOSFET 100 can be miniaturized to achieve a linear dimension along the length direction of the mMOSFET 100, when not including the isolation region 105, down to only $3\lambda$.

The fourth feature of the present invention is that the length S(L) and the length D(L) which are well-defined by the self-alignment technology could create the narrower length C-S(L) of the contact-hole 109 and the narrower length C-D(L) of the contact-hole 111, respectively, without being limited by photolithographic misalignment tolerances because the most critical masking step of creating the contact-holes 109, 111 has been eliminated. Moreover, a deposited interconnection layer of a metal-1 which can sufficiently fill into the contact-holes 109, 111 so as to make natural metal contacts connecting the metal-1 to both the source 103 and the drain 107, respectively, could be defined by a photolithographic masking technique effectively to achieve a narrow width (i.e. a sum of the contact-hole opening and two times of PMT) of the metal-1.

With the aforementioned inventions, a MOSFET structure could be miniaturized on the smallest device-length dimension (including isolation and interconnection of the metal-1) without being enlarged by unavoidable photolithographic misalignment tolerances.

Figure 2A:
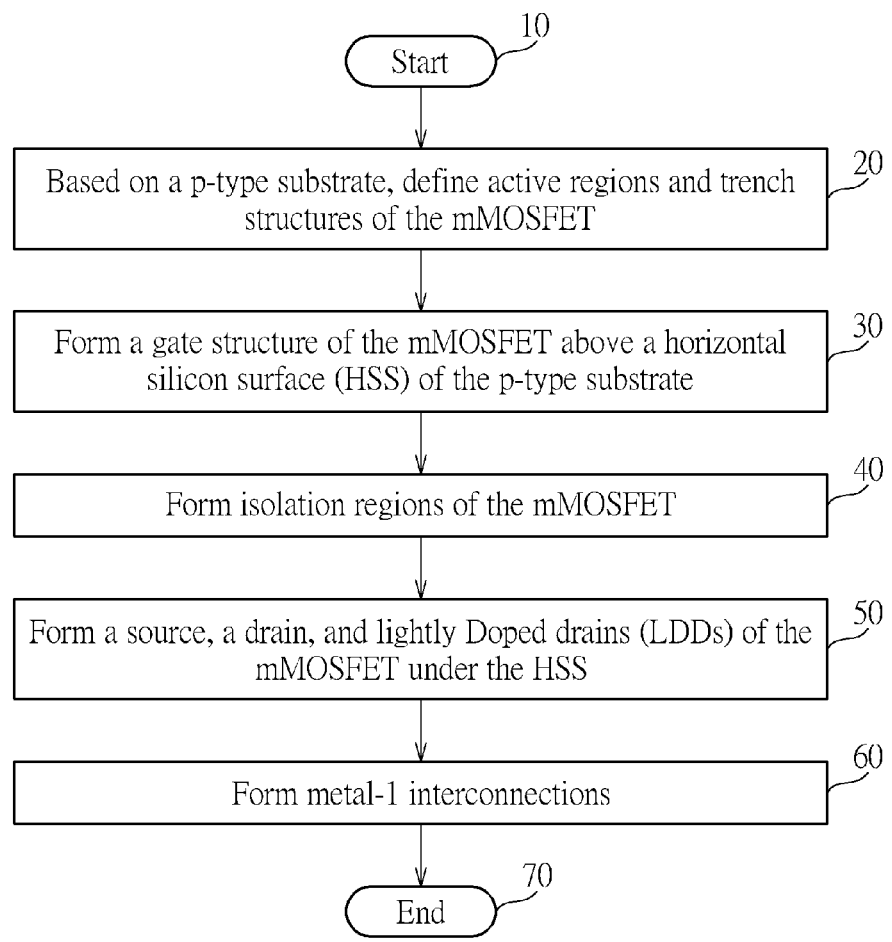
FIG. 2A is a flowchart illustrating a manufacturing method of an mMOSFET according to another embodiment of the present invention.

Please refer to FIGS. 2A-2F, 3, 4, 6-19. FIG. 2A is a flowchart illustrating a manufacturing method of an mMOSFET according to one embodiment of the present invention, wherein the manufacturing method of the mMOSFET in FIG. 2A can make the mMOSFET have precisely controllable lengths on both a source and a drain of the mMOSFET. Detailed steps are as follows:

Step 10: Start.
Step 20: Based on a substrate 102, form an active region and a trench structure.
Step 30: Form a true gate of the mMOSFET and dummy shield gates above a horizontal silicon surface (HSS) of the substrate 102.
Step 40: Replace the dummy shield gates by isolation regions to define the boundary of source/drain regions.
Step 50: Form the source region and the drain region of the mMOSFET.
Step 60: Form smaller contact holes within the boundary of the source region and the drain region, and form metal-1 interconnections to contact the source region or the drain region through the contact hole(s).

Step 70: End.

Figure 2B:
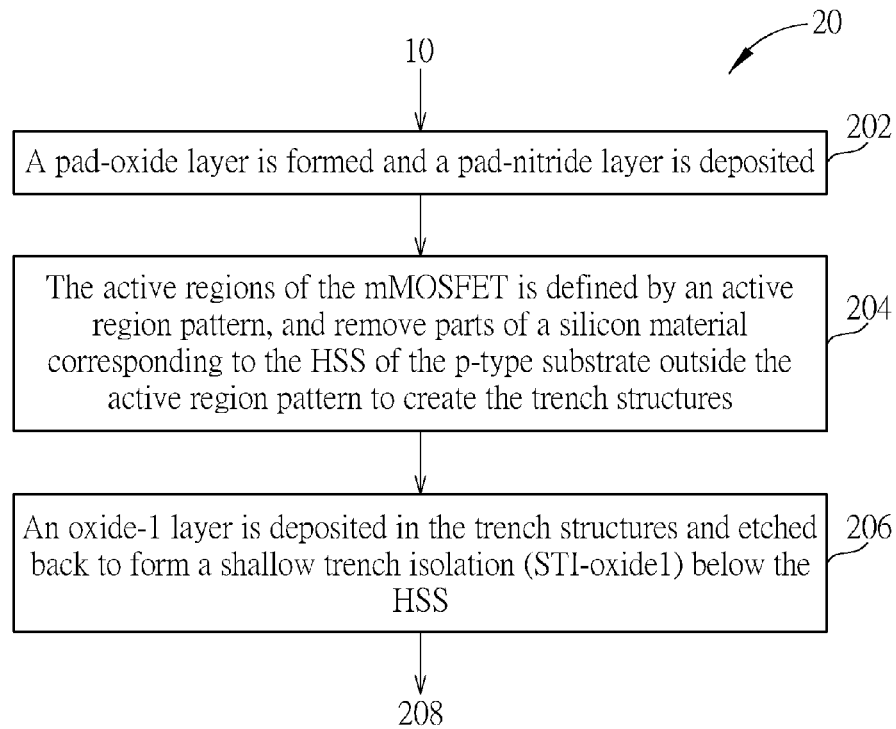
FIGS. 2B-2F are diagrams illustrating FIG. 2A.
Figure 3:
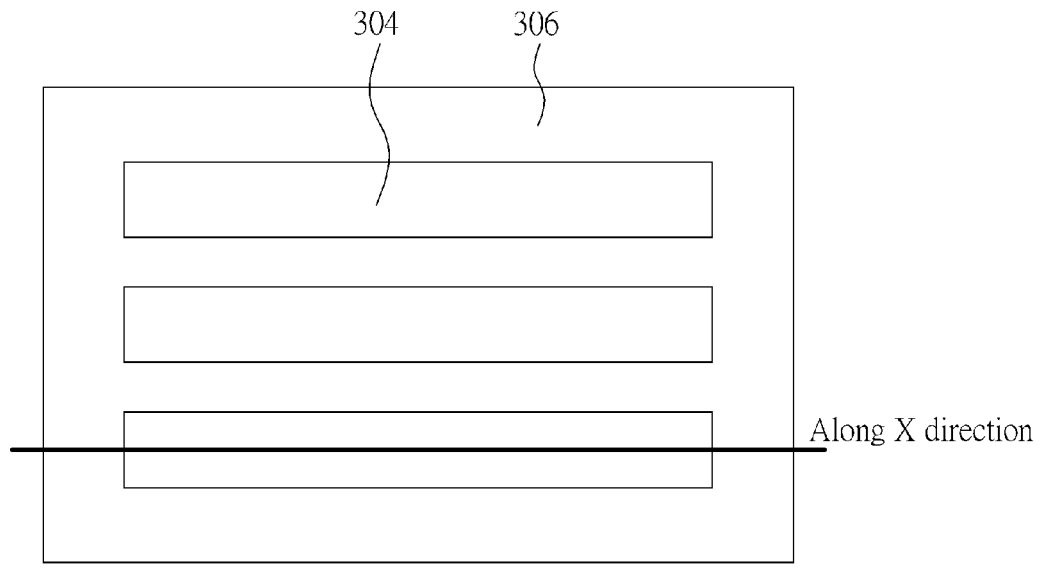
FIG. 3 is a diagram illustrating a top view of the pad-nitride layer and the STI-oxide1.
Figure 4:
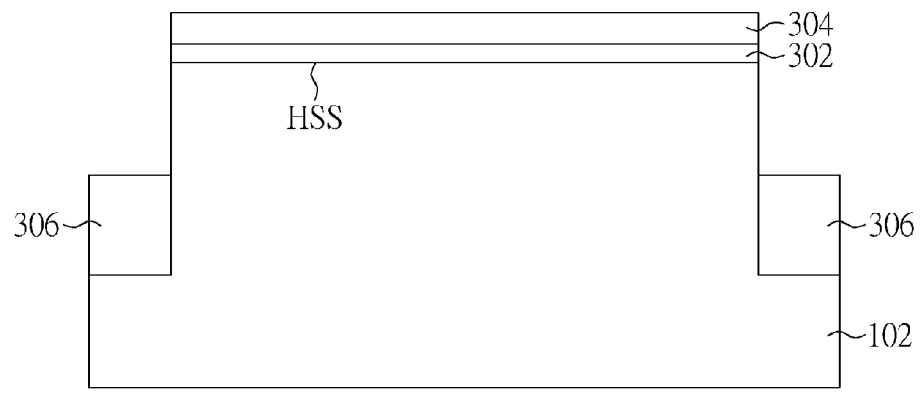
FIG. 4 is a diagram illustrating a cross-section view along an X direction shown in FIG. 3.

Please refer to FIG. 2B and FIGS. 3, 4. Step 20 could include:

Step 202: A pad-oxide layer 302 is formed and a pad-nitride layer 304 is deposited on the substrate 102.

Step 204: The active region of the mMOSFET is defined, and remove parts of silicon material outside the active region to create the trench structure.

Step 206: An oxide-1 layer is deposited in the trench structure and etched back to form a shallow trench isolation (STI-oxide1) 306 below the HSS.

Step 207: The pad-oxide layer 302 and the pad-nitride layer 304 are removed, and a dielectric insulator 402 is formed over the HSS.

Figure 2C:
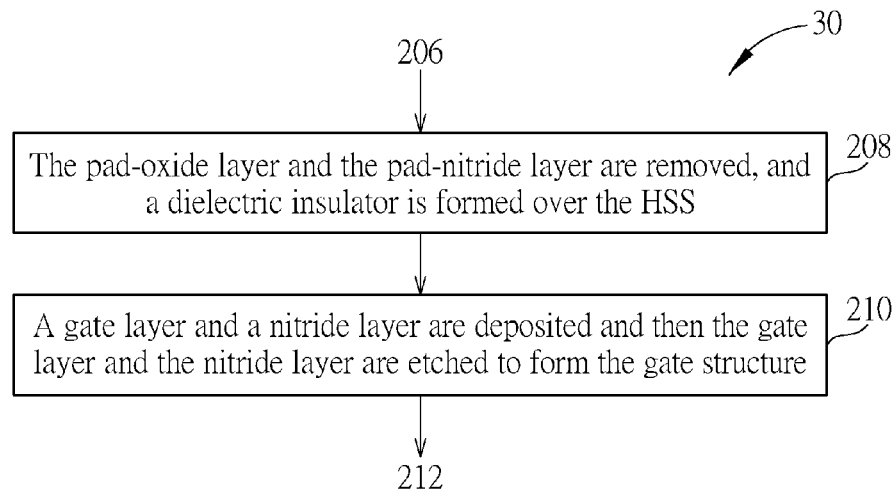
Figure 2D:
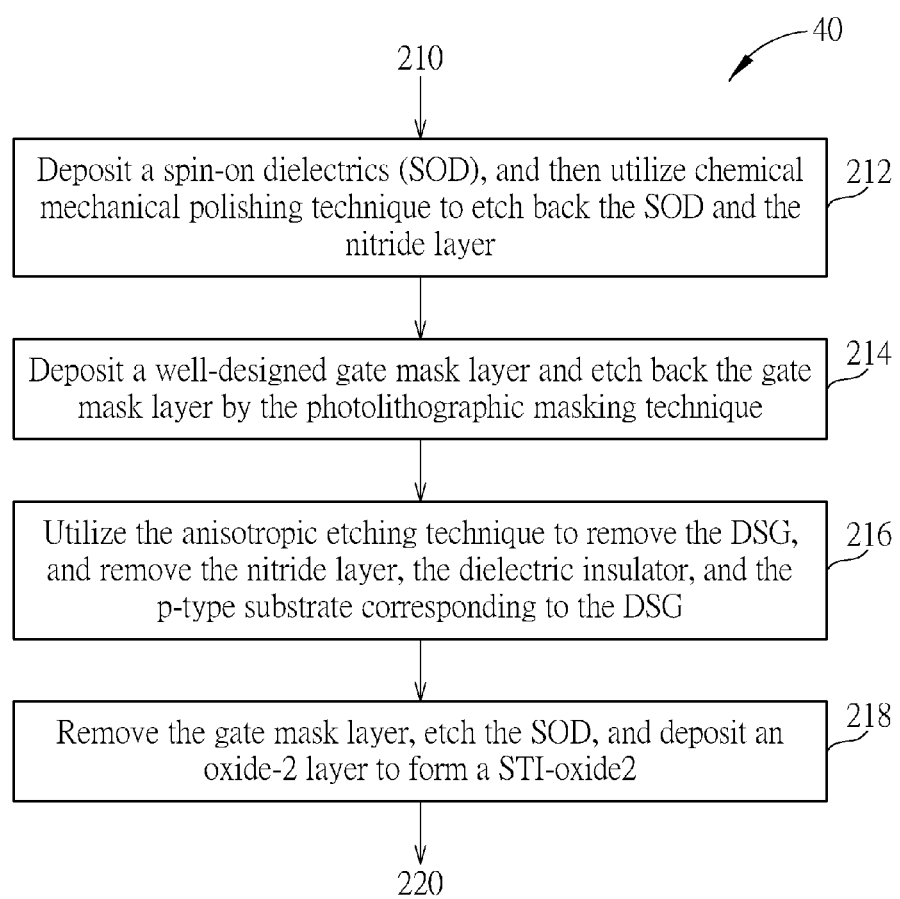
Figure 2E:
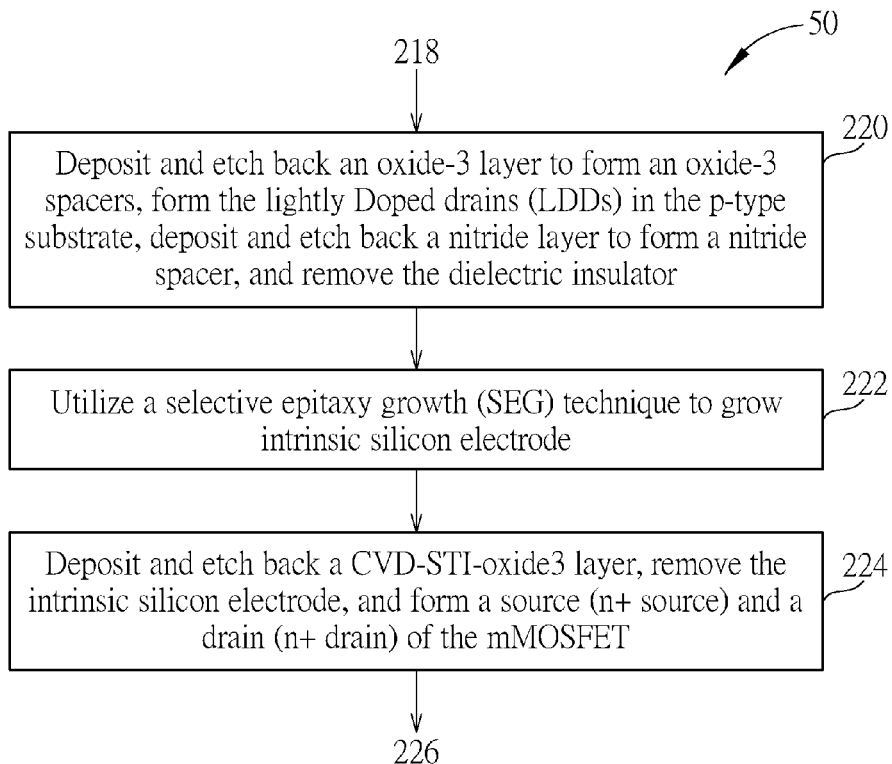
Figure 6:
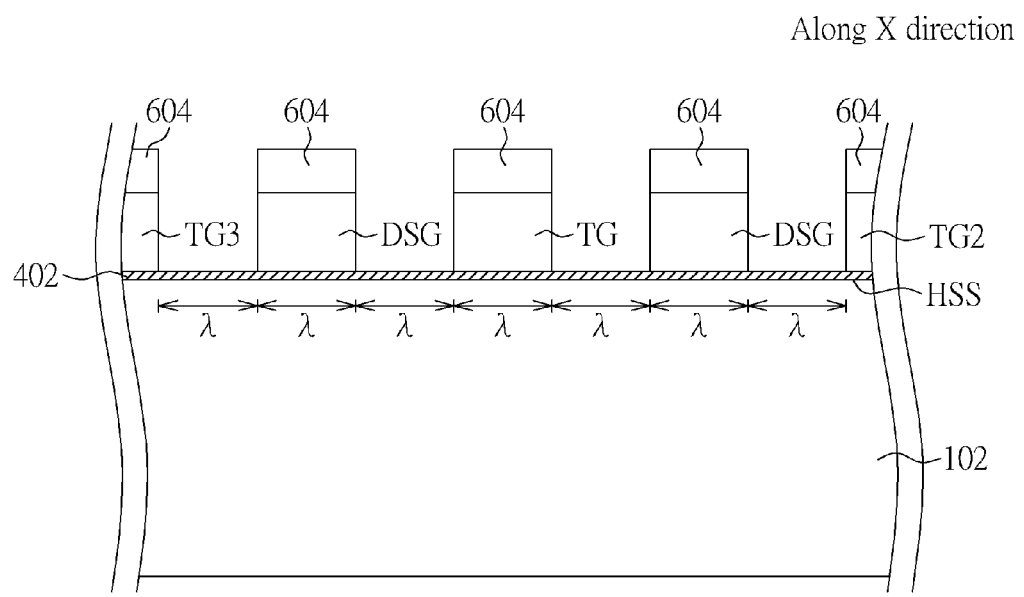
FIG. 6 is a diagram illustrating a new structural which can eliminate the above-mentioned negative effect of the PMT.

Please refer to FIG. 2C and FIG. 6. Step 30 could include:

Step 208: A gate layer 602 and a nitride layer 604 are deposited above the HSS.

Step 210: The gate layer 602 and the nitride layer 604 are etched to form a true gate of the mMOSFET and dummy shield gates with a desired linear distance to the true gate.

Please refer to FIG. 2D and FIGS. 7-10. Step 40 could include:

Step 212: Deposit a spin-on dielectrics (SOD) 702, and then etch back the SOD 702.

Step 214: Form a well-designed gate mask layer 802 by the photolithographic masking technique.

Step 216: Utilize the anisotropic etching technique to remove the nitride layer 604 above the dummy shield gate (DSG), and remove the DSG, portion of the dielectric insulator 402 corresponding to the DSG, and the p-type substrate 102 corresponding to the DSG.

Step 218: Remove the gate mask layer 802, etch the SOD 702, and deposit a STI-oxide-2 1002 and then etch back.

Please refer to FIG. 2E and FIGS. 15-17. Step 50 could include:

Step 220: Deposit and etch back an oxide-3 layer to form an oxide-3 spacer 1502, form the lightly Doped drains (LDDs) 1504 in the p-type substrate 102, deposit and etch back a nitride layer to form a nitride spacer 1506, and remove the dielectric insulator 402.

Step 222: Utilize a selective epitaxy growth (SEG) technique to grow intrinsic silicon electrode 1602.

Step 224: Deposit and etch back a CVD-STI-oxide3 layer 1702, remove the intrinsic silicon 1602, and forma source region (n+ source) 1704 and a drain region (n+ drain) 1706 of the mMOSFET.

Figure 2F:
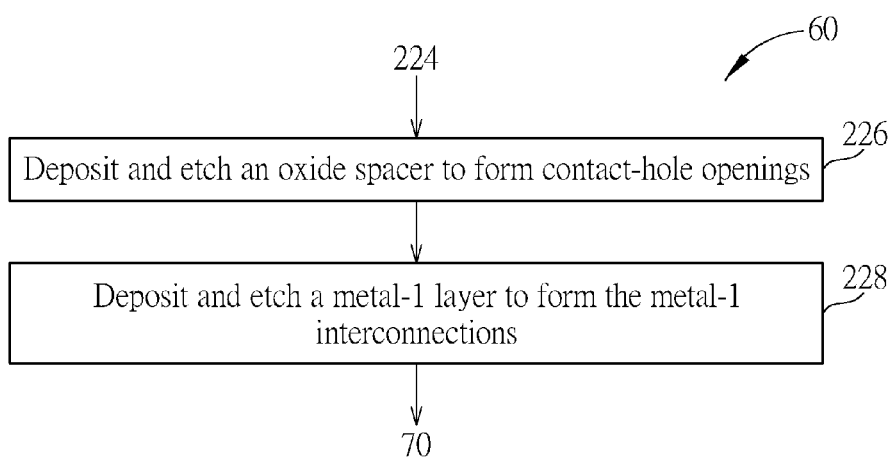

Please refer to FIG. 2F and FIGS. 18, 19. Step 60 could include:

Step 226: Deposit and etch an oxide spacer 1802 to form contact-hole openings above the source and drain regions.

Step 228: Deposit and etch a metal-1 layer 1902 to form the metal-1 interconnections.

Part I. Utilizing Dummy-Shield-Gate (DSG) Added on Gate-Level Mask to Achieve Making the Designed Distance from the Gate Edge to the Boundary Edge Between the Source and the Isolation Region (GEBESI) Sharply on the Wafer by Avoiding Photolithographic Misalignment Tolerances (PMT), and Similarly on the Drain (GEBEDI)

Takes an n-type MOSFET as an example, the substrate 102 would be a p-type substrate 102 and detailed description of the aforesaid manufacturing method is as follows. Start with Step 20, please refer to FIG. 2B, and FIGS. 3, 4. In Step 202, the pad-oxide layer 302 is formed over the HSS of the p-type substrate 102 and then the pad-nitride layer 304 is deposited above the pad-oxide layer 302.

In Step 204, the active region of the mMOSFET can be defined by a photolithographic masking technique, wherein the HSS outside the active region is exposed accordingly. Because the HSS outside the active region pattern is exposed, the parts of the silicon material outside the active region can be removed by an anisotropic etching technique to create the trench structure.

In Step 206, the oxide-1 layer is deposited to fully fill the trench structures and then the oxide-1 layer is etched back to form the STI-oxide1 306 below the HSS, as shown in FIG. 4. FIG. 4 is a cross-section view along an X direction shown in FIG. 3. In addition, because FIG. 3 is a top view, FIG. 3 only shows the pad-nitride layer 304 and the STI-oxide1 306. Then, in Step 207, the pad-oxide layer 302 and the pad-nitride layer 304 on the active regions are removed, and a dielectric insulator 402 (with high-K) is formed over the HSS.

Figure 5:
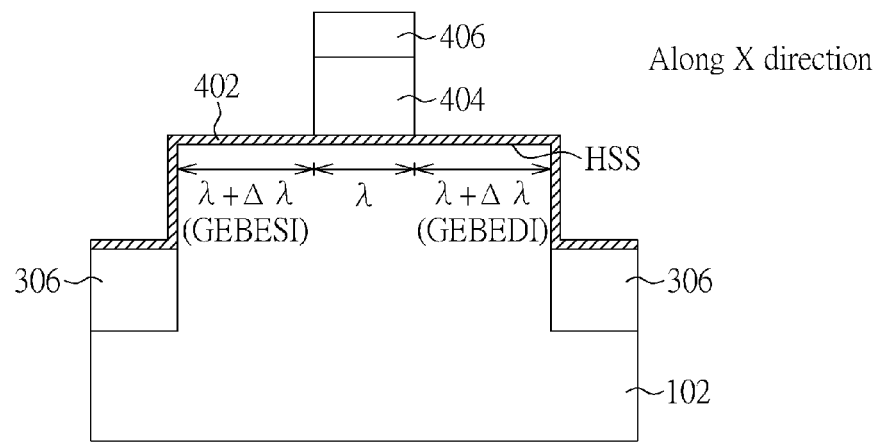
FIG. 5 is a diagram illustrating photolithographic misalignment tolerance (PMT) for an alignment of an edge of the gate structure to an edge of a boundary between a source of the mMOSFET and the STI-oxide1.

FIG. 5 describes the normal state-of-the-art design and processing method of accomplishing the geometric relationship between the Gate region and the transistor isolation region (STI) with a smaller dimensional size. After the dielectric insulator 402 (with high-K) is formed over the HSS, a gate layer 404 (metal gate) is deposited above the dielectric insulator 402, and then a nitride layer 406 (nitride-cap) with a well-designed thickness is deposited above the gate layer 404. Then, as shown in FIG. 5, the photolithographic masking technique is utilized to define a region for the gate structure 1, wherein the gate structure 1 includes the gate layer 404 and the nitride layer 406 to make the gate structure 1 have suitable metal-gate material which delivers required work-function of MIS (metal insulator to substrate) for achieving a suitable threshold voltage of the mMOSFET. In addition, because the STI-oxide1 306 is made below the HSS, the Tri-gate or fin field-effect transistor (FinFET) structure has been formed (shown in FIG. 5).

After a first photolithography process utilized to define a pseudo length of an active region and a second photolithography process utilized to define the length G(L) in the active region, a distance from an edge of the gate structure to the edge of the boundary between the source of the mMOSFET (or the drain of the mMOSFET) and a shallow trench isolation, named as GEBESI (or GEBEDI), could be defined as shown in FIG. 5.

However, as shown in FIG. 5, there exists an unavoidable non-ideal factor called as photolithographic misalignment tolerance (PMT) during the photolithographic masking technique for an alignment of an edge of the gate structure 1 to an edge of a boundary between a source of the mMOSFET and the STI-oxide1 306 (similarly on the other side of a drain of the mMOSFET). If the PMT measured in a linear dimension along the X direction is $\Delta\lambda$, $\Delta\lambda$ should be correlated to the minimal feature size as dictated by the photolithographic resolution of the equipment available for the specified processing node. For example, a 7-nm process node should have $\lambda$ equal to 7 nm and $\Delta\lambda$ of the PMT could be 3.5 nm or so. Therefore, if the desired actual physical length of the source of the mMOSFET (or the drain of the mMOSFET) is targeted at $\lambda$ (e.g. 7 nm), then a designed length of the source of the mMOSFET (or the drain of the mMOSFET) under the prior art process method must be larger than a sum of $\lambda$ and $\Delta\lambda$ (e.g. >10.5 nm).

Therefore, this present invention utilizes a new structure which can eliminate the above-mentioned negative effect of the PMT. That is, whatever dimension of a distance from an edge of the gate structure to the edge of the boundary between the source of the mMOSFET (or the drain of the mMOSFET) and a shallow trench isolation, named as GEBESI (or GEBEDI), is desired to be achieved, there is no need to reserve extra dimension for the PMT along the length direction (i.e. the X direction shown in FIGS. 4, 5) of the mMOSFET 100.

In Step 208, as shown in FIG. 6, after the dielectric insulator 402 (with high-K) is formed over the HSS, the gate layer 602 and the nitride layer 604 are deposited. Then in Step 210, the gate layer 602 and the nitride layer 604 are etched to form the gate structure (wherein the gate layer 602 could be the gate structure of the mMOSFET). A major difference between the new structural shown in FIG. 6 and the structure shown in FIG. 5 is that, when a true gate (TG) of the mMOSFET is defined by the photolithographic masking technique, dummy shield gates (DSG) are also defined in parallel to the TG with a desired, so targeted linear distance (e.g. λ, such as 7 nm in the 7-nm process node) exists between the DSG and the TG without reserving any extra dimension (i.e. Δλ) for the PMT. Both the DSG and the TG designed on the same mask could be formed simultaneously on a top of the dielectric insulator 402 which covers the active regions. In addition, as shown in FIG. 6, TG2, TG3 correspond to other mMOSFETs.

Figure 7:
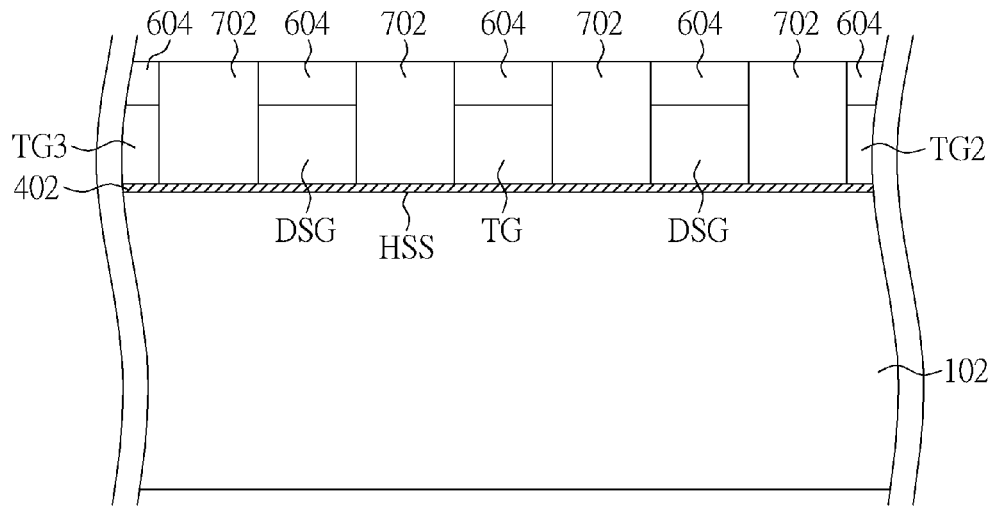
FIG. 7 is a diagram illustrating the spin-on dielectrics (SOD) being deposited.

The following steps describe how to replace the dummy shield gates by isolation regions which are raised above the HSS. In Step 212, as shown in FIG. 7, the SOD 702 is deposited and the chemical mechanical polishing (CMP) technique is utilized to etch back the SOD 702, and make a top of the SOD 702 as tall as a top of the nitride layer 604.

Figure 8:
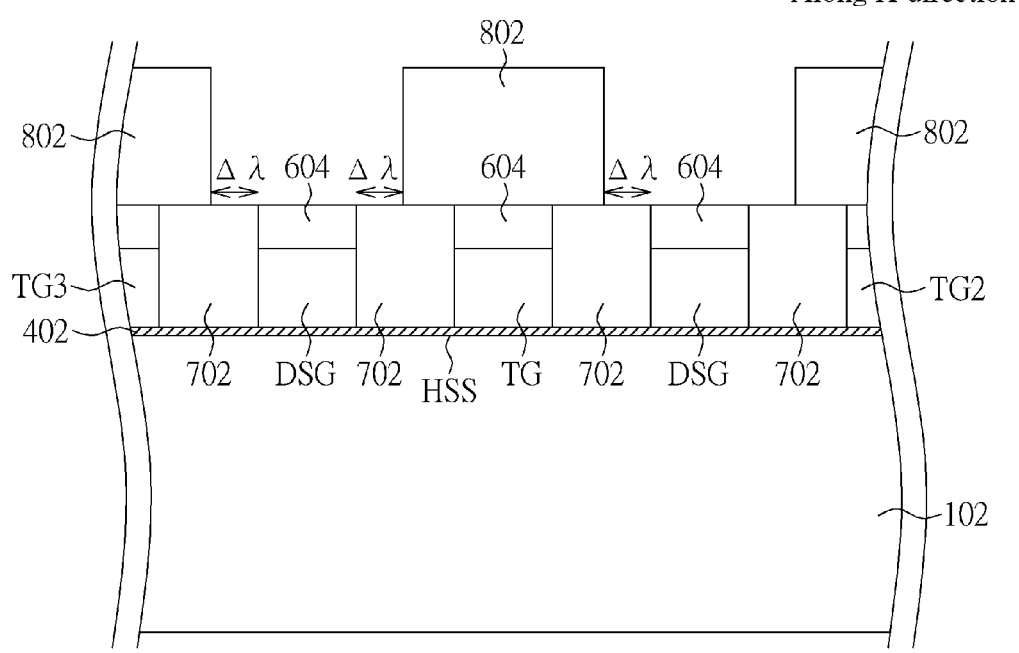
FIG. 8 is a diagram illustrating the well-designed gate mask layer being deposited and etched.

In Step 214, as shown in FIG. 8, the gate mask layer 802 is deposited, and then the gate mask layer 802 is etched by the photolithographic masking technique to accomplish a target of covering the TG, TG2, TG3 but exposing the DSG with a safe PMT margin Δλ at a middle of such lengths of GEBESI and GEBEDI, respectively (FIG. 8).

For clarification, a distance between TG which is under gate mask layer 802 and its left-hand side DSG (right-hand side DSG) in FIG. 8 could also be marked as GEBESI (or GEBEDI), because after replacing DSGs by isolation regions described in following FIGS. 9-10, the distance between TG and DSGs in FIG. 8 will become the distance from an edge of TG to the edge of the boundary between the source of the mMOSFET (or the drain of the mMOSFET) and the isolation region, as previously mentioned GEBESI (or GEBEDI) in FIG. 5.

In Step 216, as shown in FIG. 9(*a*), the anisotropic etching technique is utilized to etch away the DSG and the nitride layer 604 corresponding to the DSG, and further to etch away part of the dielectric insulator 402 corresponding to the DSG so as to reach the HSS, and then the anisotropic etching technique is utilized to remove the silicon material of the p-type substrate 102 below the HSS to form trenches 902 under the HSS, wherein a depth of the trenches 902 could be equal to a depth of a bottom of the STI-oxide1 306. Therefore, as shown in FIG. 9(*a*), the PMT is avoided in creation of precisely controlled lengths of GEBESI and GEBEDI, respectively. Since the lengths of GEBESI and GEBEDI are well defined by the TG and the DSG on the same mask, both the length S(L) of the source region and the length D(L) of the drain region shown in FIG. 1 are thus well defined and made. That is, this single photolithographic masking technology is not only used for defining the TG and the DSG, but also for controlling the lengths of the GEBESI and the GEBEDI. Therefore, the dimensions of the length S(L) and the length D(L) can be accurately controlled even for achieving an optimally minimized dimension as small as the minimum feature size λ. Because the length S(L) and the length D(L) can be can be equal to λ, the length S(L) and the length D(L) are substantially equal to the length of the TG (i.e. the gate structure). In addition, FIG. 9(*b*) is a top view corresponding to FIG. 9(*a*).

In Step 218, as shown in FIG. 10(*a*), the gate mask layer 802 and the SOD 702 are removed. Then the STI-oxide-2 layer 1002 is deposited to fill the trenches 902 and other vacancies on the HSS, and the STI-oxide-2 layer 1002 could be etched back to a surface level equal to the HSS, as shown in FIG. 10(*a*). FIG. 10(*b*) is a top view corresponding to FIG. 10(*a*).

Therefore, the DSG which is temporarily formed is replaced by the STI-oxide-2 layer 1002 to define the boundary of the source/drain regions. Then any existing ways of forming lightly doped drains (LDDs), spacers surrounding the TG, the source region, and the drain region can be used to complete the mMOSFET, wherein the source region and the drain region would be formed respectively according to the precisely controlled GEBESI and the GEBEDI.

Part II. Using Dummy Shield Gate (DSG) Design Principle for Variable Shapes of Active Regions (on an Active Region (Δλ) Mask) by an Adaptive Dummy Shield Gate (DSG) Design to Achieve the Targeted Length of the GEBESI and the GEBEDI, Respectively Since a shape of an isolation region of a transistor and a position of the isolation region from the transistor to neighboring transistors could be quite varied (even from the above-mentioned embodiment), another structure invention on how to design an adaptive DSG by extending principles of the above-mentioned embodiment is described in the following.

Figure 11:
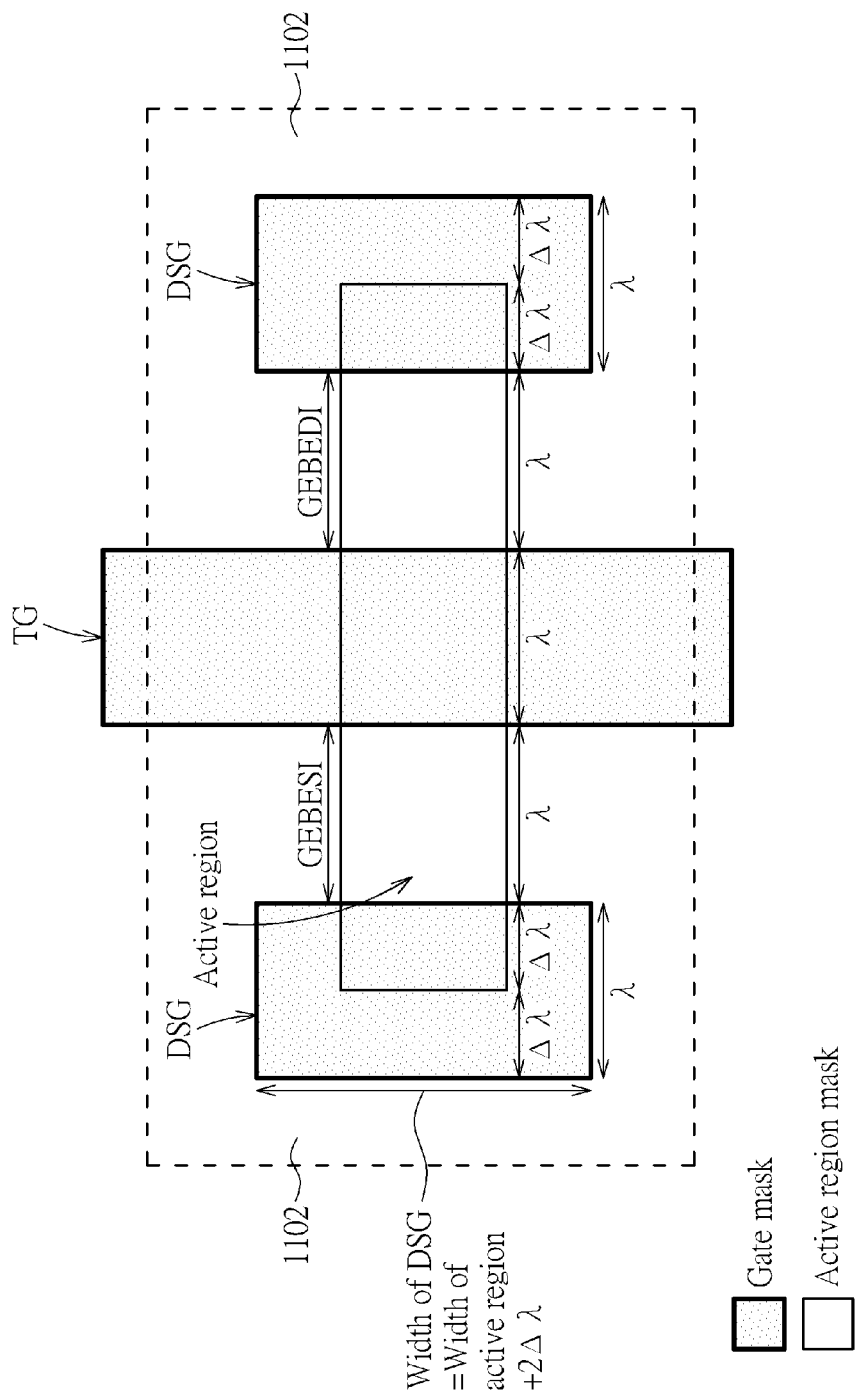
FIGS. 11-14 are diagrams illustrating relationships between a position of the true gate (TG) and a position of the dummy shield gate (DSG).

FIG. 11 shows a different geometric condition where active regions of neighboring transistors are laid out differently from FIG. 6. For example, as shown in FIG. 6, adjacent active regions of the neighboring transistors are made to be connected before the true gate (TG), true gate 2 (TG2), true gate 3 (TG3) and the dummy shield gate (DSG) are deposited, and then the DSG is used for dividing the connected active regions into individual precisely-targeted distance by a length of the DSG. But, as shown in FIG. 11, it is assumed that an active region on a source (or a drain) of a transistor is totally isolated (by isolation region 1102) from any other active regions before and after a TG of the transistor is defined. Therefore, what is proposed here is how to design both the active region on the source side and an adaptive DSG as described below (similarly for the drain). For example, if a final length of the GEBESI is targeted at λ (or any other targeted length L(S)), and then a length of an active region mask ("AA mask") corresponding to the GEBESI side should be designed to be equal to a sum of λ and Δλ (or a sum of the length L(S) and Δλ). Then on a gate mask, the DSG could have a shape as shown in FIG. 11, that is, a rectangular shape for the DSG has a length equal to λ and a width equal to a sum of a width of the active region and 2Δλ (each side shares 0.5Δλ, respectively). The designed distance between the TG and the DSG on the source side is still just the length of GEBESI, e.g. λ.

Figure 12:
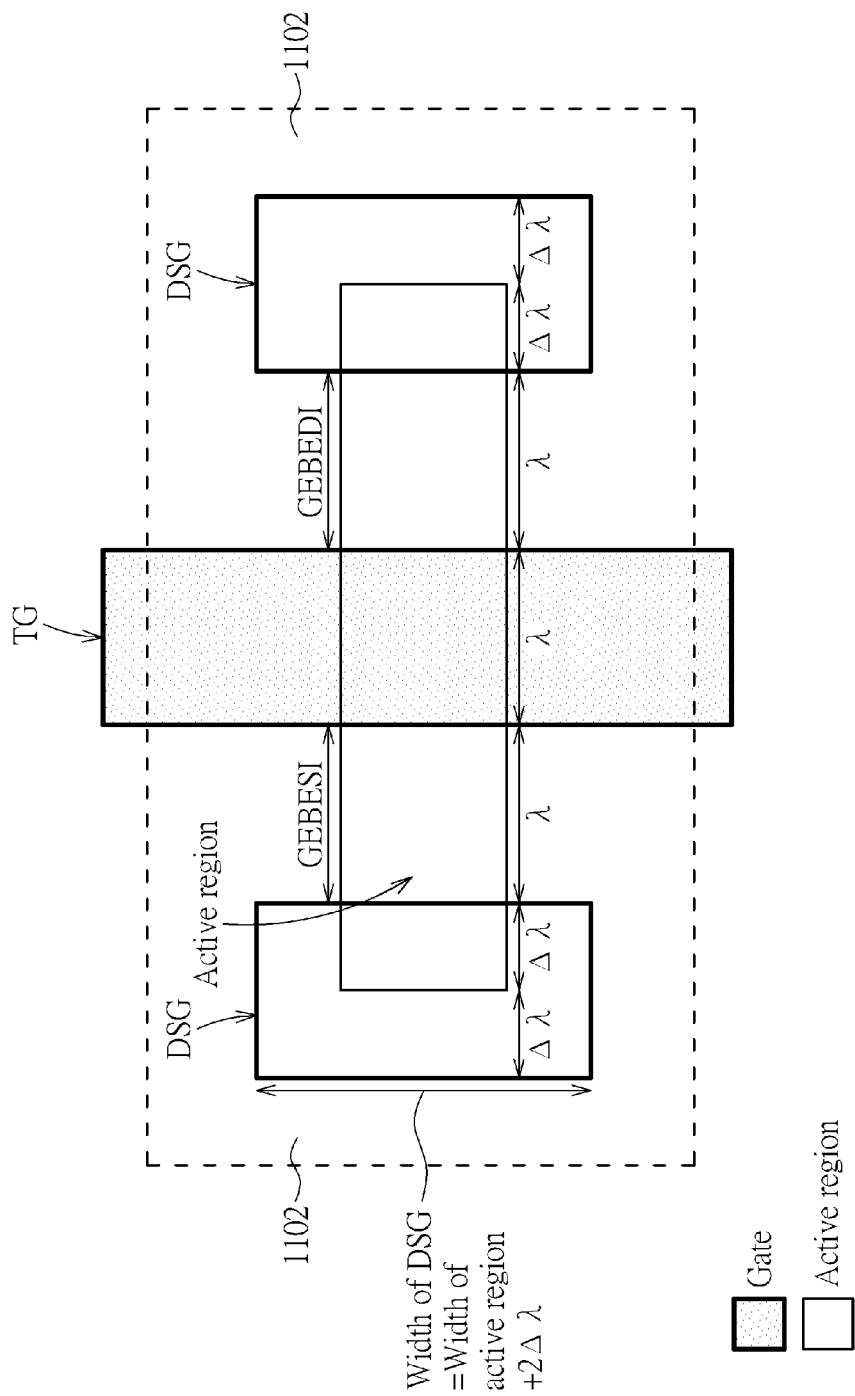
Figure 13:
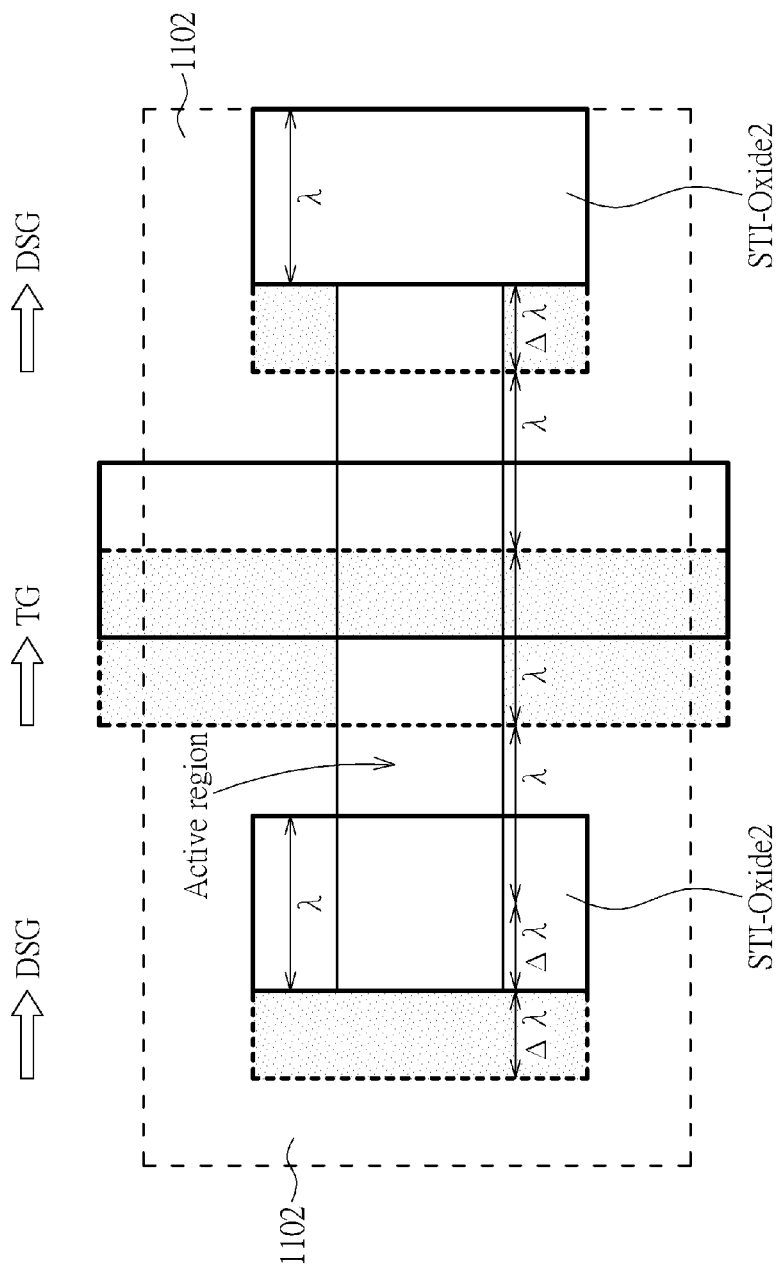
Figure 14:
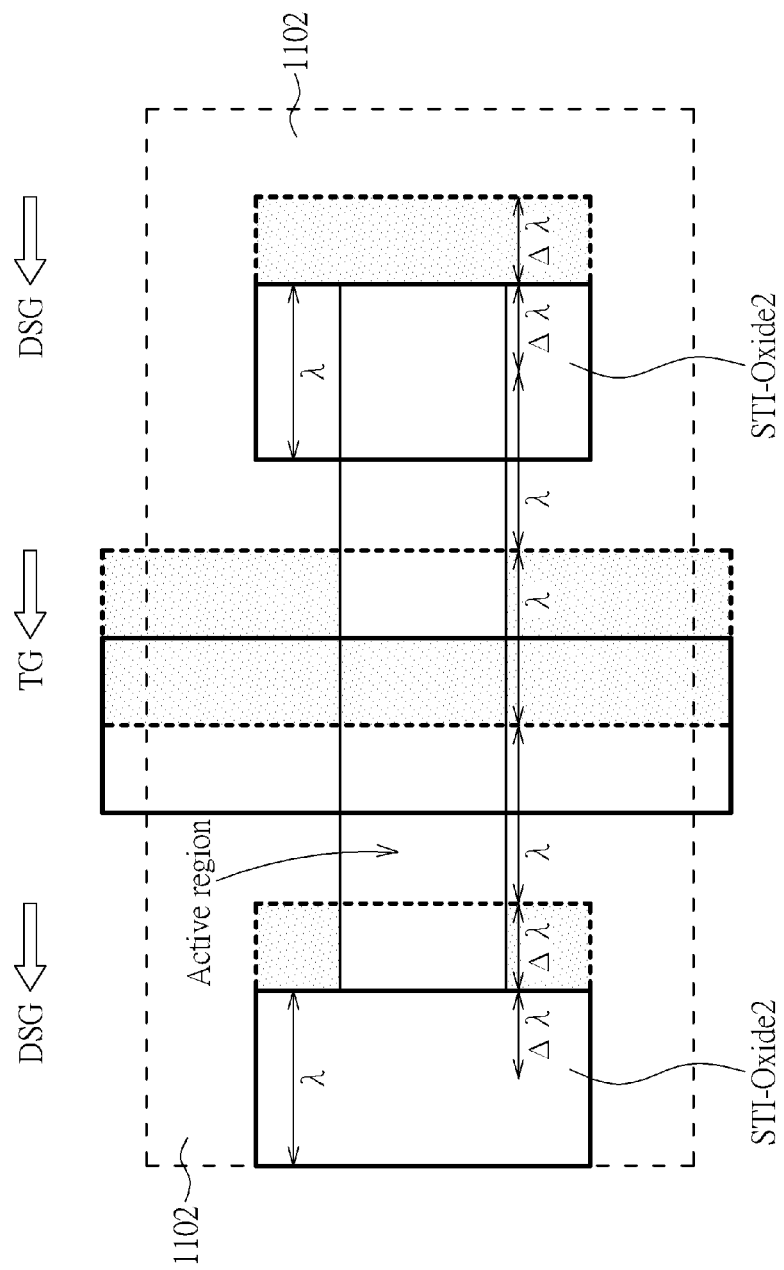

The result derived from mask levels of the active region and the gate of FIG. 11 onto wafer level is portrayed in FIG. 12. As shown in FIG. 12, when the TG is defined by the photolithographic masking technique, the DSG is made in parallel to the TG with a targeted distance (e.g. λ, such as 7 nm in the 7-nm process node) between the DSG and the TG. With a nominal processing result (that is, no significant misalignment is induced by the photolithographic processing), the DSG covers partially the active region (corresponding to the source) by a distance $\Delta\lambda$ and both the TG and the DSG are printed on the top of the dielectric insulator 402 which covers the active regions. There are nitride-cap layers on the top of both the TG and the DSG.

If the PMT causes a shift (e.g. $\Delta\lambda$) of both the TG and the DSG toward the right-hand side of the active region (FIG. 13), the subsequent processing to remove the DSG for achieving isolation region (i.e. STI-oxide-2) exactly at the location of this previously existing the DSG location as described by the aforementioned processing steps in the Part I should result in the STI-oxide-2 layer with a length $\lambda$ and the STI-oxide-2 layer turns out a physical geometry of the source region which has its GEBESI length equal to $\lambda$ (since the distance between the TG and the DSG is designed to be equal to $\lambda$). On the other hand, if the PMT causes a shift (e.g. $\Delta\lambda$) of both the TG and the DSG toward the left-hand side of the active region (FIG. 14), the subsequent processing steps of removing the DSG and forming the STI-oxide-2 layer will result in the STI-oxide-2 layer with a length $\lambda$ and the source region has still its GEBESI length equal to $\lambda$.

When the PMT causes undesirable shifts along the width direction (that is, up or down direction) of the active region, the design of such an adaptive dummy shield gate having the width of the sum of the width of the active region and $2\Delta\lambda$ should not affect the geometric dimensions of the active region. The novel design of using the adaptive dummy shield gate can always result in the STI-oxide2 with the length $\lambda$ and the length of the GEBESI fit to the designed target (e.g. as narrow as $\lambda$). The present invention can surely be applied to all varied shapes of isolation regions, source and drain with their individual targeted lengths, respectively.

Part III. Precisely Defined Source (or Drain) Region Enables a Precisely Controlled Contact-Hole Opening by Self-Aligned Spacers to Eliminate the Contact Mask and the Hole-Opening Process Step After disclosing how both GEBESI and GEBEDI can be optimally designed and fabricated to a precisely controlled small dimension (which can be as small as $\lambda$), another new invention is how to create a smaller dimension (called as length C-S(L) and length C-D(L), respectively, as defined in FIG. 1) of the contact-hole openings than the lengths of GEBESI and GEBEDI, respectively. Two designs and the process formations are described in the following.

A. Design and Process (I)

By continuing FIG. 10(*a*) and utilizing the TG to explain in the following, in Step 220, as shown in FIG. 15(*a*), the oxide-3 layer is deposited and etched back to form the oxide-3 spacer 1502, wherein the oxide-3 spacer 1502 covers the TG. Then, lighted doped zones are formed in the p-type substrate 102 and rapid thermal annealing (RTA) is performed on the lighted doped zones to form the lightly Doped drains (LDDs) 1504 next to the TG. Then the nitride layer is deposited and etched back to form the nitride spacer 1506, wherein the nitride spacer 1506 covers the oxide-3 spacer 1502. The dielectric insulator 402 not covered by the nitride spacer 1506 and the oxide-3 spacer 1502 is removed. In addition, FIG. 15(*b*) is a top view corresponding to FIG. 15(*a*).

In Step 222, as shown in FIG. 16(*a*), by utilizing the exposed HSS as silicon growing seeds, the selective epitaxy growth (SEG) technique is utilized to grow the intrinsic silicon 1602 only above the exposed HSS to a height as tall as the top of the nitride-cap 604 (over a top of the TG). In addition, FIG. 16(*b*) is a top view corresponding to FIG. 16(*a*).

In Step 224, as shown in FIG. 17(*a*), the CVD-STI-oxide3 layer 1702 is deposited to fill all vacancies and planarized by the CMP technique to achieve a planar surface leveled up to the top of nitride-cap 604 which is over the top of the TG. Then the intrinsic silicon 1602 is removed so as to expose the HSS corresponding to source and drain regions which are surrounded by the CVD-STI-oxide3 layer 1702 and the nitride spacer 1506.

The intrinsic silicon 1602 is just like a self-alignment pillar (SPR) to enclose or block an area in which a contact hole will be allocated later. Such self-alignment pillar is not necessarily limited to silicon material. Depending on the material of the seeds exposed for selective epitaxy growth, the self-alignment pillar could be metal material or other semiconductor material (such as, SiC, SiGe, GaN, etc.) Furthermore, the substrate could be silicon substrate, SiC substrate, SiGe substrate or GaN substrate.

Any existing ways of forming the source region (n+ source) 1704 and the drain region (n+ drain) 1706 of the mMOSFET can be carried out to achieve flat surfaces of the source region 1704 and the drain region 1706 with the HSS, wherein the source region (n+ source) 1704 could be a first conductive region and the drain region (n+ drain) 1706 could be a second conductive region. In addition, as shown in FIG. 17(*a*), a channel region exists between the lightly Doped drains (LDDs) 1504 and under the HSS, and the channel region is electrically coupled to the source region (n+ source) 1704 and the drain region (n+ drain) 1706. In addition, as shown in FIG. 17(*a*), the source region (n+ source) 1704 is positioned between the gate structure (i.e. the TG (the gate layer 602)) and the STI-oxide-2 1002 and the CVD-STI-oxide3 layer 1702 which are located at a left-hand side of the gate structure, wherein both the STI-oxide-2 1002 and the CVD-STI-oxide3 layer 1702 located at the left-hand side of the gate structure could be named as a first isolation region, and the first isolation region is next to the first conductive region (i.e. the source region (n+ source) 1704). In addition, as shown in FIG. 17(*a*), the drain region (n+ drain) 1706 is positioned between the gate structure and the STI-oxide2 1002 and the CVD-STI-oxide3 layer 1702 which are located at a right-hand side of the gate structure, wherein both the STI-oxide2 1002 and the CVD-STI-oxide3 layer 1702 located at the right-hand side of the gate structure could be named as a second isolation region, and the second isolation region is next to the second conductive region (i.e. the drain region (n+ drain) 1706). In addition, as shown in FIG. 17(*a*), it is obvious that the first isolation region and the second isolation region extend upward and downward from the HSS. In addition, FIG. 17(*b*) is a top view corresponding to FIG. 17(*a*).

In Step 226 to form the contact holes, as shown in FIG. 18(*a*), because the CVD-STI-oxide3 layer 1702 located above the isolation regions and the nitride spacer 1506 surrounding the TG are taller than the HSS as four sidewalls, the well-designed oxide spacer 1802 (called as oxide spacer for contact hole (oxide-SCH)) can be created outside the four sidewalls to form a first contact hole 1804 positioned above the first conductive region (i.e. the source region (n+ source) 1704) and also within the boundary of the source region 1704. Similarly, a second contact hole 1806 positioned above the second conductive region (i.e. the drain region (n+ drain) 1706) and also within the boundary of the drain region 1706. Therefore, as shown in FIG. 18(*a*), the contact-holes 1804 and 1806 are naturally formed in such a self-alignment way without using any etching technique to do the contact-hole openings, and by a suitable design of the oxide-SCH with a thickness tOSCH such a contact-hole opening has a length dimension smaller than the lengths of the GEBESI and the GEBEDI, respectively. What is new here is that the contact-hole opening is almost located at a center of the boundary of the source region (or the drain region), and a length of the contact-hole opening could be designed smaller than $\lambda$ (since length of contact hole=the length of the GEBESI minus 2 times the thickness tOSCH. Therefore, for instance, if the thickness tOSCH=0.2$\lambda$ and the length of the GEBESI=$\lambda$, then a length of the contact hole=0.6$\lambda$). Therefore, because the length of the contact-hole opening is mainly dominated by the thickness tOSCH of the oxide-SCH 1802, a periphery of the first contact hole 1804 (and the second contact hole 1806) is independent from the photolithographic masking process, and as shown in FIG. 18(*b*), it is obvious that the periphery of the first contact hole 1804 is within a circumference of the first conductive region, and the periphery of the second contact hole 1806 is within a circumference of the second conductive region.

In addition, as shown in FIG. 18(*a*), because the length of the contact-hole opening is smaller than $\lambda$, the length of the first contact hole 1804 (and the second contact hole 1806 as well) is less than a length of the gate structure (because as shown in FIG. 6, the length of the gate structure is equal to $\lambda$). In addition, as shown in FIG. 18(*a*), because the oxide spacer 1802 has the thickness tOSCH and the length of the GEBESI is equal to the length of the gate structure, it is obvious that a horizontal distance between a first sidewall (located at the left-hand side of the gate structure) of the gate structure and a sidewall of the first contact hole 1804 which is remote from the gate structure is less than the length (i.e. $\lambda$) of the gate structure. In addition, as shown in FIG. 18(*a*), it is also obvious that a horizontal distance between the first sidewall of the gate structure and a sidewall of the first conductive region (i.e. the source region 1704) which is remote from the gate structure is approximately equal to the length of the gate structure. Similarly, as shown in FIG. 18(*a*), a horizontal distance between a second sidewall (located at the right-hand side of the gate structure) of the gate structure and a sidewall of the second isolation region remote from the gate structure is substantially equal to the length of the gate structure.

In addition, as shown in FIG. 18(*a*), the oxide spacer 1802 located at the left-hand side of the gate structure and near the gate structure (i.e. a first spacer) covers the first sidewall of the gate structure, and the oxide spacer 1802 located at the left-hand side of the gate structure and remote from the gate structure (i.e. a second spacer) covers a sidewall of the first isolation region 1702, wherein the first contact hole 1804 is formed between the first spacer and the second spacer.

In addition, as shown in FIG. 18(*a*), the oxide spacer 1802 located at the right-hand side of the gate structure and near the gate structure (i.e. a third spacer) covers a second sidewall (located at the right-hand side of the gate structure) of the gate structure, and the oxide spacer 1802 located at the right-hand side of the gate structure and remote from the gate structure (i.e. a fourth spacer) covers a sidewall of the second isolation region, wherein the second contact hole 1806 is formed between the third spacer and the fourth spacer.

In addition, as shown in FIG. 18(*b*), it is also obvious that the periphery of the first contact hole 1804 is surrounded by the circumference of the first conductive region (or the source region), a shape of the periphery of the first contact hole 1804 is similar to a shape of the circumference of the first conductive region, and the circumference of the first conductive region has a rectangular-like shape. Similar situation is applied to the second contact hole 1806 and the second conductive region (or the drain region).

According to the present invention, this self-alignment contact hole should present itself as the smallest contact length than contact length of any prior art design and process of creating contact-hole openings by using the photolithographic masking process and further using complex etching process technique in such a smaller dimension than A. In addition, the present invention eliminates the most difficult-to-be-controlled and the most expensive mask for defining and making metal-1 contacts (such as the contact holes for source and drain regions) and its subsequent tasks of drilling the contact-hole openings. In addition, FIG. 18(*b*) is a top view corresponding to FIG. 18(*a*).

In Step 228 to form the metal-1 connection, please refer to FIG. 19. After the metal-1 layer 1902 is deposited to fill the contact-holes and then the photolithographic masking technique can be used to define the metal-1 layer 1902. As shown in FIG. 19, the metal-1 layer 1902 must have a width fully covering the contact-hole opening and reserving any unavoidable PMT in a precisely controlled dimension. That is, the width of the metal-1 layer 1902=the length C-S(L) of the contact-hole opening (above the source region) plus 2$\Delta\lambda$, and equally on the contact-hole opening above the drain region, the length C-D(L) of the contact-hole opening plus 2$\Delta\lambda$, respectively. If the length of the contact-hole opening could be controlled to 0.6$\lambda$ (which should be under control since the dimension of the oxide spacer 1802 inside the contact hole could be well controlled as described above in calculations), then the width of the metal-1 layer 1902 could be as small as a sum of the length of the contact-hole opening and 2$\Delta\lambda$ (if in one embodiment of the present invention, $\Delta\lambda$=0.5$\lambda$ (i.e. a half of the length of the gate structure), and the length of the contact-hole opening=0.6$\lambda$, then the width of the metal-1 layer 1902 could be as narrow as 1.6$\lambda$ in order to fully cover the contact-hole opening under unavoidable PMT, that is, the width of the metal-1 layer 1902 could be equal to the length of the first contact hole 1804 plus the length of the gate structure in order to fully cover the contact-hole opening under unavoidable PMT). According to the present invention, the width of the metal-1 layer 1902 as narrow as 1.6$\lambda$ could be one of the smallest widths of the metal-1 interconnections. In addition, a minimum space 1904 between two nearest metal-1 interconnections should not be smaller than $\lambda$. In addition, as shown in FIG. 19, the metal-1 layer 1902 (i.e. a first metal region) fills in the first contact hole 1804 and contacts the first conductive region (i.e. the source 1704), wherein the first metal region extends upward from the first conductive region to a predetermined position which is higher than the top of the nitride layer 604 (i.e. the cap layer).

In addition, as shown in FIG. 20, if there is no adjacent metal-1 interconnection, for example, by using a merged semiconductor junction and metal conductor (MSMC) structure (disclosed in U.S. patent application Ser. No. 16/991,044 and filed on 2020 Aug. 12, the whole content of which is enclosed herein by reference) for the source (and/or the drain) which in case is grounded and connected directly to the p-type substrate 102 of the mMOSFET, then the width of the CVD-STI-oxide3 layer 1702 which was defined by dummy shield gate can be made as small as the minimum feature size $\lambda$ without being limited by the space between any adjacent metal-1 interconnection. In addition, as shown in FIG. 20, the source region includes a first semiconductor region (N+ heavily doped semiconductor region) 1906 and a first metal containing region 1908, and the drain region includes a second semiconductor region (N+ heavily doped semiconductor region) 1910 and a second metal containing region 1912, wherein a first oxide guard layer (OGL) 1914 only covers a sidewall of the first metal containing region 1908 and does not cover a bottom of the first metal containing region 1908, and a second oxide guard layer 1916 (within a concave shown in FIG. 20) covers a sidewall and a bottom of the second metal containing region 1912. Therefore, the first metal containing region 1908 is coupled to the p-type substrate 102 through a bottom of the first metal containing region 1908.

The important merit of the present invention is that almost every critical dimension such as the lengths of the GEBESI, the GEBEDI and the contact-hole opening and the width of the metal-1 interconnection could be precisely controlled without being affected by the uncertainties of PMT, thus assuring their reproducibility, quality and reliability due to the uniformity of the critical dimensions.

B. Design and Process (II)

The principle described as above is adopted in the following embodiment but the only difference is how to form the spacers and contact-hole openings. By continuing FIG. 9(*a*), as shown in FIG. 21(*a*), the gate mask layer 802 is removed, and then the oxide-2 layer is deposited to fill the trenches 902 and other vacancies on the HSS to form a STI-oxide-2 2102 and then the STI-oxide-2 2102 is planarized by the CMP to make a top of the STI-oxide-2 2102 as high as to the top of the SOD 702 and the top of the nitride layer 604 which is over the TG. In addition, FIG. 21(*b*) is a top view corresponding to FIG. 21(*a*).

Then, as shown in FIG. 22(*a*), the SOD 702 is removed. The oxide-3 layer is deposited and etched back by the anisotropic etching technique to form an oxide-3 spacer 2202, wherein the oxide-3 spacer 2202 covers the TG. Then, lighted doped zones are formed in the p-type substrate 102 and rapid thermal annealing (RTA) is performed on the lighted doped zones to form the lightly Doped drains (LDD) 2204 next to the TG. Then, the nitride layer is deposited and etched back to form a nitride spacer 2206, wherein the nitride spacer 2206 covers the oxide-3 spacer 2202. And then, the dielectric insulator 402 underneath the previously existing SOD 702 is removed. In addition, FIG. 22(*b*) is a top view corresponding to FIG. 22(*a*).

Then, as shown in FIG. 23(*a*), by using the exposed HSS regions as silicon growing seeds, the selective epitaxy growth (SEG) technique is utilized to grow an intrinsic silicon 2302 only above the exposed HSS to a height as tall as the top of nitride-cap 604 which is over the top of the TG. A difference from the previous section A of part III is that a shape of the SEG intrinsic silicon 2302 could be better controlled since two sides of the SEG intrinsic silicon 2302 are sandwiched between the STI-oxide-2 2102 and the TG, and the other two sides of the SEG intrinsic silicon 2302 are facing air above cliff edges of the active region, wherein the active region is still covered by the dielectric insulator 402 and above adjacent STI-oxide1. Then, a CVD-STI-oxide3 layer 2304 (shown in FIG. 23(*b*)) is deposited to fill all vacancies and planarized by the CMP technique to achieve a planar surface leveled up to the top of nitride-cap 604 (over the top of the TG). In addition, FIG. 23(*b*) is a top view corresponding to FIG. 23(*a*).

Furthermore, as shown in FIG. 24(*a*), the intrinsic silicon 2302 is removed so as to expose the HSS in regions for a source (n+ source) 2402 and a drain (n+ drain) 2404 which are surrounded by two walls of the CVD-STI-oxide3 layer 2304, a wall of the nitride spacer 2206 on the STI-oxide-2 2102, and a wall of the nitride spacer 2206 surrounding the TG. Any existing ways of forming the source region 2402 and the drain region 2404 of the mMOSFET can be carried out to achieve flat surfaces of the source region 2402 and the drain region 2404 with the HSS.

As shown in FIG. 24(*a*), since the two walls of the CVD-STI-oxide3 layer 2304, the nitride spacer 2206 on the STI-oxide2 2102, and the nitride spacer 2206 surrounding the TG are all taller than the HSS as four sidewalls, another well-designed four oxide spacers 2406 (called as oxide spacer for contact-Hole, oxide-SCH) can be newly created to cover the four sidewalls. Therefore, the contact-hole openings are naturally formed in such the self-alignment way without using any etching technique of making contact-openings, and by the suitable design of oxide-SCH with the thickness of tOSCH such a contact-hole opening has a length dimension smaller than the lengths of the GEBESI and the GEBEDI, respectively. What is new here is that the contact-hole opening is located at the center of both the boundary of the source region and the drain region, respectively, and the length of the contact-hole opening could be designed smaller than λ (since length of the contact hole=the length of the GEBESI minus 2 times tOSCH. Therefore, for instance, if tOSCH=0.2λ and the GEBESI=λ, then the length of the contact hole=0.6λ). According to the present invention, this self-alignment contact hole should present itself as the smallest contact length than contact length of any prior art design and process of creating contact-hole openings by using photolithographic masking process step and further using complex etching process technique in such a smaller dimension than λ. In addition, the present invention eliminates the most difficult-to-be-controlled and the most expensive mask for defining and making metal-1 contacts and its subsequent tasks of drilling the contact-hole openings. In addition, FIG. 24(*b*) is a top view corresponding to FIG. 24(*a*).

Figure 25:
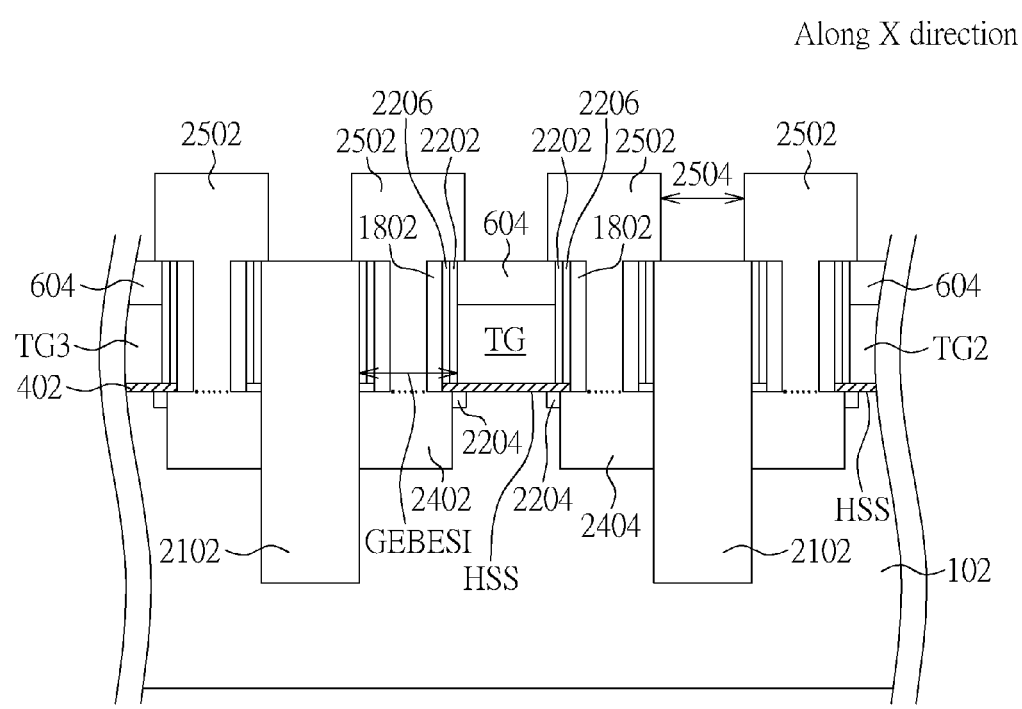
FIG. 25 is a diagram illustrating the metal-1 layer being deposited and etched to form the metal-1 interconnections.

FIG. 25 shows the results after that a metal-1 layer 2502 is deposited to fill the contact-hole opening and then the photolithographic masking technique can be used to define the metal-1 layer 2502. As shown in FIG. 25, the metal-1 layer 2502 must have its width fully covering the contact-hole opening and reserving any unavoidable PMT in a precisely controlled dimension. That is, the width of the metal-1 layer 2502=the length C-S(L) of the contact-hole opening plus 2Δλ, and equally on the drain, the length C-D(L) of the contact-hole opening plus 2Δλ, respectively. If the contact-hole opening could be controlled to 0.6λ (which should be under control since the dimension of the oxide spacer 2406 inside the contact hole could be well controlled as described above in calculations), then the width of the metal-1 layer 2502 could be as small as a sum of the length of the contact-hole opening and 2Δλ (if Δλ=0.5λ, the length of the contact-hole opening=0.6λ, then the width of the metal-1 layer 2502 could be as narrow as 1.6λ in order to fully cover the contact-hole opening under unavoidable PMT). According to the present invention, the width of the metal-1 layer 1902 as narrow as 1.6λ could be one of the smallest width of the metal-1 interconnection. The minimum space 2504 between two nearest metal-1 interconnections should be not smaller than λ. The important merit of the present invention is that almost every critical dimension such as the lengths of the GEBESI, the GEBEDI and the contact-Hole opening and the width of the metal-1 interconnection could be precisely controlled without being affected by the uncertainties of PMT, thus assuring their reproducibility, quality and reliability due to the uniformity of these critical dimensions.

To sum up, there are several major enhancements for future integrated-circuit design resulted from the above-embodiments of the present invention on MOSFET structures by avoiding photolithographic misalignment tolerances, especially having fundamental improvements related to the design and processing on the geometrical relationship between gate and source, gate and drain, contact-hole openings between metal-1 and source/drain, as well as on the width of metal-1 interconnections and its self-alignment way of filling the contact holes:

(1) Precisely define the length S(L) and the length D(L) from the two edges of the gate, respectively, by eliminating the uncertainties due to photolithographic misalignment tolerances.

(2) Both the length S(L) and the length D(L) could be designed and made to the minimum feature size λ allowed by the photolithographic masking and processing resolutions, which significantly minimizes the sizes of the source and the drain and thus reduces areas of the MOSFETs and both standby and active currents and power, as well as enhances the operational speed of the MOSFETs accordingly.

(3) Since both the length S(L) and the length D(L) are accurately controlled, the invented self-alignment technology by creating spacers from the four side walls surrounding both the source and the drain, respectively, can accurately create the self-alignment contact holes (SACH) with controllable shapes and sizes near the centers of both the source and the drain, respectively.

(4) The length of the SACH can be designed in a dimension smaller than the minimal feature size λ, e.g. as small as 0.6λ or even narrower.

(5) The other width dimension of such a SACH could be well designed by the self-alignment spacers and the width of the well-defined active region; since this SACH is formed by the spacer technology which depends on well-developed technology of employing chemical film deposition with controllable thickness and using the anisotropic etching technique instead of the state-of-the-art ways of defining contact holes by photolithographic masking technique with hard-to-controlled misalignment tolerances and shapes of the contact holes, the contact-hole opening of the present invention could be well designed and defined (though the contact-hole may not have the uniform square contact shape, the contact-hole does have a well-defined rectangular shape and the filling results really depends on the narrow length dimension of the contact hole).

(6) Eliminate the most challenging and expensive contact-making steps and masks.

(7) Change the contact-hole design from one square hole or multiple square holes with exhaustive separations between multiple contact holes to a rectangular shape of a single contact-hole or single contact-trench; as a result the width (or length) of the source (or the drain) can be just the same as the width (or length) of the gate without being limited by using a dog-bone layout to adjusting the dimensional difference between the width of the gate width and the width of the source (or the drain) which may have a multiple of square-shape contact holes.

(8) A metal-1 interconnection with well-designed thickness can surely fill all existing contact holes since the success of this filling depends on the minimum dimension of the contact hole which is usually the length of the SACH so that the state-of-the-art two steps for forming contact studs (such as Tungsten filling plus a planarization process which are known as a Tungsten stud process and a metal-1 damascene process) can be simplified to a one metal-1 disposition process.

(9) With such an integrated SACH and metal-1 formation process, and the gate is buried under a nitride-cap and protected by spacers both of which create a flat plateau on the rest areas outside the SACH, the metal-1 interconnections can be designed to have multiple layout ways of creating an optimally distributed interconnected network of the metal-1.

(10) By a combination of the above advantages a new mMOSFET structure can be created to have a very small size which has the smallest length dimension of 4λ (that is, including the length S(L)=λ, the length D(L)=λ, the gate length=λ, ½λ for accounting left-hand side isolation and ½λ for accounting right-hand side isolation) and the smallest width dimension of 2λ, that is, a world's smallest single transistor with both contact holes and metal-1 interconnections on contacting both the source and the drain, respectively, has been achieved in an area of $8\lambda^2$.

Of course, depending on the design requirement, the length G(L), the length S(L) or the length D(L) could be greater than the minimum feature length λ.

(11) All advantages are not limited by only applying to a single MOSFET but also to CMOS (complementary metal oxide semiconductor) circuits such as many optimized functional cells in terms of their areas, e.g. SRAM (static random access memory), NAND gate, NOR gate and random logic gates can be achieved by using design and fabrication Principles as invented here to reduce the chip area, currents, power and speed with accuracy, reproducibility, uniformity and robust margins due to inventions by eliminating the uncertainties from photolithographic misalignment tolerances and adopting the novel self-alignment design and process techniques.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A transistor structure comprising:
a semiconductor substrate with a semiconductor surface;
a gate structure;
a channel region under the gate structure;
a first conductive region electrically coupled to the channel region; and
a contact hole positioned above the first conductive region;
wherein a length of the contact hole is less than a minimum feature length, and a horizontal distance between a sidewall of the gate structure and a sidewall of the contact hole which is remote from the gate structure is less than the minimum feature length or approximately equal to the minimum feature length.

2. A transistor structure comprising:
a semiconductor substrate with a semiconductor surface;
a gate structure with a length;
a channel region under the semiconductor surface;
a first isolation region extending upward and downward from the semiconductor surface;
a first spacer covering a first sidewall of the gate structure;
a first semiconductor region electrically coupled to the channel region and positioned between the gate structure and the first isolation region, wherein at least an external sidewall surface and a top surface of the first semiconductor region are contacted by a first metal zone; and a first contact hole, wherein the first contact hole is formed between the first spacer and the first isolation region.

3. The transistor structure in claim 2, further comprising:
a cap layer covering the gate structure;
wherein the first metal zone comprises a first metal region filling in the first contact hole and contacting the top surface of the first semiconductor region, the first metal zone further comprises a first metal containing region under the semiconductor surface and contacting the external sidewall surface of the first semiconductor region.

4. The transistor structure in claim 3, further comprising a first guard layer isolating a bottom of the first semiconductor region and a bottom of the first metal containing region from the semiconductor substrate.

5. The transistor structure in claim 4, wherein the first guard layer is an L shape oxide layer.

6. The transistor structure in claim 2, further comprising:
a second isolation region extending upward and downward from the semiconductor surface; and
a second semiconductor region electrically coupled to the channel region and positioned between the gate structure and the second isolation region;
wherein at least one sidewall surface of the second semiconductor region is contacted by a second metal contacting region under the semiconductor surface.

7. The transistor structure in claim 6, further comprising:
a second contact hole positioned above the second conductive region, wherein a length of the second contact hole is less than a minimum feature length, wherein a horizontal distance between a second sidewall surface of the gate structure and a sidewall surface of the second isolation region remote from the gate structure is substantially equal to the minimum feature length.

8. The transistor structure in claim 6, further comprising:
a second guard layer isolating a bottom of the second semiconductor region from the semiconductor substrate, wherein the second guard layer does not isolate a bottom of the second metal contacting region from the semiconductor substrate.

9. A transistor structure comprising:
a semiconductor substrate with a semiconductor surface;
a gate structure with a length;
a channel region;
a first conductive region electrically coupled to the channel region; and
a first isolation region next to the first conductive region;
wherein a length of the first conductive region is controlled by a single photolithography process which is originally configured to define the length of the gate structure.

10. The transistor structure in claim 9, wherein a length of the first conductive region is equal to or substantially equal to a minimum feature length.

11. A transistor structure comprising:
a semiconductor substrate with a semiconductor surface;
a gate structure with a length;
a channel region;
a first conductive region electrically coupled to the channel region; and
a first contact hole;
wherein a length of the first conductive region is equal to or substantially equal to the a minimum feature length, wherein the minimum feature length is not greater than 28 nm.

12. The transistor structure in claim 11, wherein a length of the first contact hole is less than the minimum feature length.

13. The transistor structure in claim 11, wherein the first contact hole is positioned above the first conductive region.

* * * * *